(12) United States Patent
Kim et al.

(10) Patent No.: US 11,700,743 B2
(45) Date of Patent: Jul. 11, 2023

(54) DISPLAY DEVICE AND METHOD FOR MANUFACTURING THE SAME

(71) Applicant: SAMSUNG DISPLAY CO., LTD., Yongin-si (KR)

(72) Inventors: Jung Hyun Kim, Suwon-si (KR); Yong-Hoon Kwon, Suwon-si (KR); Taeoh Kim, Hwaseong-si (KR); Woosuk Seo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 141 days.

(21) Appl. No.: 17/420,633

(22) PCT Filed: Jun. 27, 2019

(86) PCT No.: PCT/KR2019/007795
§ 371 (c)(1),
(2) Date: Jul. 2, 2021

(87) PCT Pub. No.: WO2020/141670
PCT Pub. Date: Jul. 9, 2020

(65) Prior Publication Data
US 2022/0123255 A1    Apr. 21, 2022

(30) Foreign Application Priority Data

Jan. 4, 2019  (KR) .................. 10-2019-0000993

(51) Int. Cl.
*H10K 50/842*     (2023.01)
*G06F 3/041*      (2006.01)
(Continued)

(52) U.S. Cl.
CPC ....... *H10K 50/8426* (2023.02); *G06F 3/0412* (2013.01); *H10K 59/12* (2023.02);
(Continued)

(58) Field of Classification Search
None
See application file for complete search history.

(56) References Cited

U.S. PATENT DOCUMENTS 8,766,323 B2     7/2014   Kim et al.
9,093,668 B2 *   7/2015   Han ................... H10K 50/8426
(Continued)

FOREIGN PATENT DOCUMENTS

CN       107500554        12/2017
EP       3051589 A1 *     8/2016   .............. G06F 1/16
(Continued)

OTHER PUBLICATIONS

"NANOWIRE: Wikipedia found at https://en.wikipedia.org/wiki/Nanowire and printed on Jul. 20, 2022".

*Primary Examiner* — Vinh T Lam
(74) *Attorney, Agent, or Firm* — F. Chau & Associates, LLC

(57) ABSTRACT

A method for manufacturing a display device according to an embodiment of the present invention includes providing a display substrate and an encapsulation substrate, each of which has a display area and a non-display area surrounding the display area thereon, forming a nanowire on the encapsulation substrate overlapping a sealing area defined as a partial area of the non-display area, and combining the encapsulation substrate and the display substrate with each other, wherein the forming of the nanowire includes irradiating a first laser, which is a ultrashort pulse laser, onto the encapsulation substrate overlapping the sealing area, and the combining of the encapsulation substrate and the display substrate with each other includes irradiating a second laser, which is a ultrashort pulse laser, onto the display substrate overlapping the sealing area.

36 Claims, 18 Drawing Sheets

(51) Int. Cl.
    *H10K 59/12*    (2023.01)
    *H10K 59/40*    (2023.01)
    *H10K 71/00*    (2023.01)
    *H10K 102/00*    (2023.01)

(52) U.S. Cl.
    CPC ............. *H10K 59/40* (2023.02); *H10K 71/00* (2023.02); *G06F 2203/04103* (2013.01); *H10K 59/1201* (2023.02); *H10K 2102/351* (2023.02)

(56) References Cited

U.S. PATENT DOCUMENTS

| | | | |
|---|---|---|---|
| 9,312,316 B2 | 4/2016 | You et al. | |
| 9,515,286 B2 * | 12/2016 | Dabich, II | C03C 3/247 |
| 9,741,963 B2 * | 8/2017 | Dabich, II | C03C 4/0071 |
| 9,761,828 B2 * | 9/2017 | Dabich, II | C03C 3/23 |
| 9,842,665 B2 * | 12/2017 | Gross | G06F 3/044 |
| 9,882,163 B2 * | 1/2018 | Park | H10K 50/8426 |
| 10,069,104 B2 * | 9/2018 | Dabich, II | C03C 3/14 |
| 10,198,103 B2 * | 2/2019 | Park | H10K 59/40 |
| 10,254,786 B2 * | 4/2019 | Dodds | G06F 3/041 |
| 10,283,731 B2 * | 5/2019 | Dabich, II | B32B 37/06 |
| 10,297,787 B2 | 5/2019 | Dejneka | |
| 10,457,595 B2 * | 10/2019 | Boek | C03C 15/00 |
| 10,578,790 B2 | 3/2020 | Son et al. | |
| 10,586,944 B2 * | 3/2020 | Ahn | H10K 85/141 |
| 10,621,909 B2 * | 4/2020 | Kwon | H10K 71/80 |
| 10,629,843 B2 * | 4/2020 | Chida | H10K 59/131 |
| 10,680,044 B2 * | 6/2020 | Go | H10K 50/8428 |
| 10,754,463 B2 * | 8/2020 | Kim | H10K 50/8426 |
| 10,768,727 B2 * | 9/2020 | Chang | G06F 3/0412 |
| 10,817,090 B2 * | 10/2020 | Gwon | G06F 3/0416 |
| 10,840,476 B2 * | 11/2020 | Lee | H10K 50/8426 |
| 10,854,851 B2 * | 12/2020 | Lee | H10K 50/84 |
| 10,858,283 B2 * | 12/2020 | Logunov | C03C 27/10 |
| 10,897,018 B2 * | 1/2021 | Jeon | H10K 50/844 |
| 11,380,218 B2 * | 7/2022 | Tsukamoto | H05B 33/06 |
| 2007/0242055 A1 | 10/2007 | Lai | |
| 2012/0070618 A1 | 3/2012 | Sakamoto et al. | |
| 2012/0267660 A1 | 10/2012 | Han et al. | |
| 2015/0261258 A1 * | 9/2015 | Kim | H10K 50/11 345/173 |
| 2015/0305166 A1 * | 10/2015 | Fried | G06F 3/045 174/250 |
| 2016/0001496 A1 * | 1/2016 | Chow | G06F 3/0446 345/173 |
| 2016/0285039 A1 | 9/2016 | Kim | |
| 2018/0149807 A1 | 5/2018 | Seo et al. | |
| 2018/0218317 A1 | 8/2018 | Hong et al. | |
| 2020/0135800 A1 * | 4/2020 | Seo | H10K 59/131 |
| 2020/0168689 A1 * | 5/2020 | Park | G02F 1/136204 |

FOREIGN PATENT DOCUMENTS

| | | | |
|---|---|---|---|
| JP | 2008-062263 | 3/2008 | |
| JP | 2008-151969 | 7/2008 | |
| JP | 2011-054477 | 3/2011 | |
| JP | 2012-104397 | 5/2012 | |
| JP | 2015-013760 | 1/2015 | |
| KR | 10-2008-0023485 | 3/2008 | |
| KR | 10-2012-0077470 | 7/2012 | |
| KR | 10-2012-0119448 | 10/2012 | |
| KR | 10-2016-0053335 | 5/2016 | |
| KR | 10-2016-0147833 | 12/2016 | |
| KR | 10-1800285 | 12/2017 | |
| KR | 10-2018-0083011 | 7/2018 | |
| KR | 10-2020-0050321 | 5/2020 | |
| WO | WO-2015112270 A1 * | 7/2015 | ......... B23K 26/0624 |
| WO | WO-2016004203 A1 * | 1/2016 | ............. G06F 3/044 |

* cited by examiner

FIG. 1
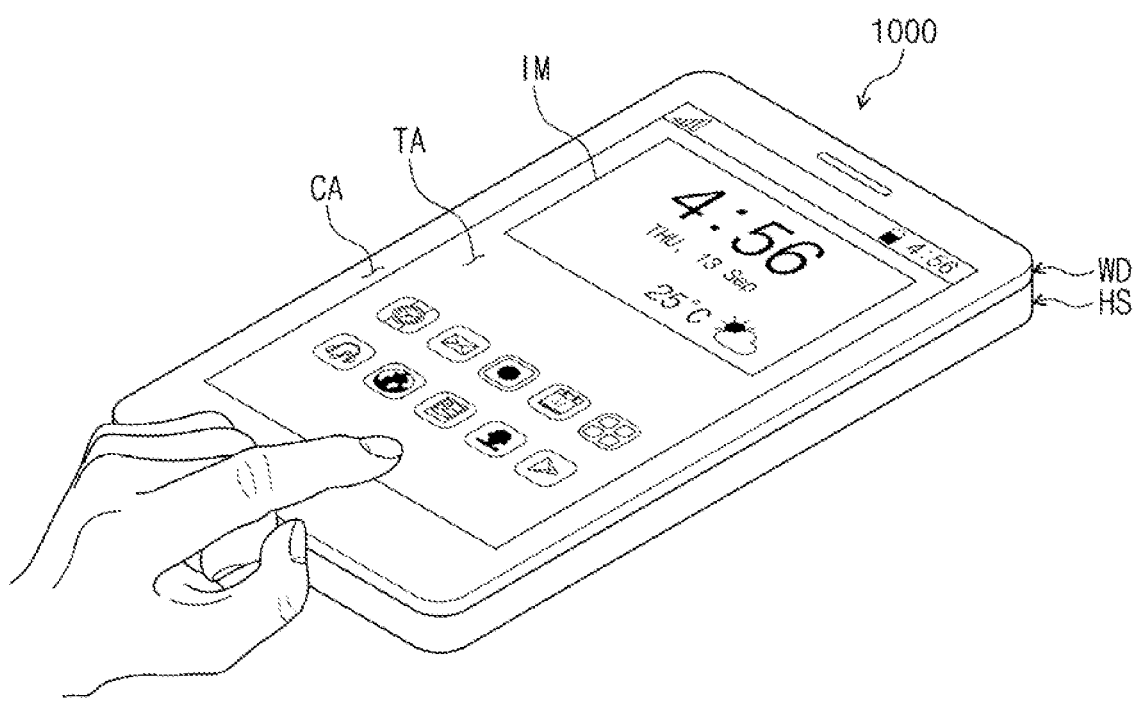
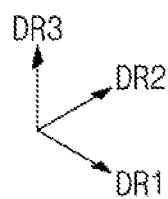

DISPLAY DEVICE AND METHOD FOR MANUFACTURING THE SAME

CROSS-REFERENCE TO RELATED APPLICATION

The present application is a National Stage application, filed under 35 U.S.C. § 371 of International Patent Application No. PCT/KR2019/007795, filed on Jun. 27, 2019, which claims priority to Korean Patent Application 10-2019-0000993, filed on Jan. 4, 2019, the entire contents of which are herein incorporated by reference.

TECHNICAL FIELD

The present invention relates to a display device, and more particularly, to a display device and a method for manufacturing the same.

DISCUSSION OF THE RELATED ART

Display devices are becoming increasingly important with the development of multimedia. Accordingly, various types of display devices such as liquid crystal displays (LCDs), organic light emitting displays (OLEDs), and the like are used.

Among the display devices, an organic light emitting display device displays an image using an organic light emitting element that generates light through recombination of electrons and holes. The organic light emitting display device has a fast response speed, high luminance, and a large viewing angle, and also being driven with low power consumption.

An organic light emitting display panel includes a display substrate on which organic light emitting elements are disposed and an encapsulation substrate covering the display substrate. As edge regions of the display substrate and the encapsulation substrate are sealed by an encapsulation member, a phenomenon in which moisture or dust is introduced into the display panel from the outside may be prevented from occurring.

SUMMARY

A display device according to an embodiment of the present invention includes a display module on which a display area and a non-display area configured to surround the display area are defined on a plane, wherein the display module includes a display substrate including a plurality of pixels disposed on the display area and including a glass material and an encapsulation substrate disposed to face the display substrate and including a glass material, wherein the non-display area includes a sealing area on which the display substrate and the encapsulation substrate are bonded to each other, and a portion of the sealing area has a width of about 50 µm to about 110 µm.

The display module may further include a first encapsulation part disposed on the sealing area to bond the display substrate to the encapsulation substrate, wherein the first encapsulation part may include the same material as each of the display substrate and the encapsulation substrate.

The first encapsulation part may have a thickness of about 5 µm to about 15 µm on the sealing area.

A plurality of boding areas may be defined on the sealing area in a cross-section, and each of an interface between the display substrate and the first encapsulation substrate and an interface between the encapsulation substrate and the first encapsulation part may be discontinuous on the bonding area.

Each of the bonding areas may have a rounded shape in the cross-section.

The display substrate may include: a base layer; a circuit layer disposed on the base layer and including a plurality of thin film transistor and a plurality of lines; and a display layer disposed on the circuit layer overlapping the display area and comprising a plurality of display elements connected to the thin film transistors.

Each of the plurality of display elements may include an organic light emitting element.

The non-display area may further include a pad area defined on the display substrate so as not to overlap the encapsulation substrate, wherein the pad area of the display substrate may be exposed by the encapsulation substrate.

The sealing area may include: a first sealing area defined as a remaining area of an edge area of the non-display area except for an area of the edge area of the non-display area, which is adjacent to the pad area; and a second sealing area defined between the pad area and the display area and connected to the first sealing area, wherein the display module may further include a second encapsulation part disposed between the display substrate and the encapsulation substrate, which overlap the second sealing area.

The first sealing area may have a width less than or equal to that of the second sealing area.

The circuit layer may be entirely disposed on an area of the display substrate except for the first sealing area.

The display module may further include an input sensing layer disposed between the encapsulation substrate and the display substrate and comprising a plurality of input sensing electrodes, wherein the input sensing layer may not overlap the sealing area on the plane.

The display module may further include an input sensing layer disposed on the encapsulation substrate to face the display substrate with the encapsulation substrate therebetween and comprising a plurality of input sensing electrodes.

A thickness of the encapsulation substrate on the sealing area may be greater than a thickness of the encapsulation substrate on the display area.

Bonding strength between the display substrate and the encapsulation substrate on the portion of the sealing area may be about 18 kgf or more.

A method for manufacturing a display device according to an embodiment of the present invention includes: providing a display substrate and an encapsulation substrate, each of which has a display area and a non-display area surrounding the display area thereon; forming a nanowire on the encapsulation substrate overlapping a sealing area defined as a partial area of the non-display area; and combining the encapsulation substrate and the display substrate with each other, wherein the forming of the nanowire comprises radiating a first laser, which is an ultrashort pulse laser, onto the encapsulation substrate overlapping the sealing area, and the combining of the encapsulation substrate and the display substrate with each other comprises radiating a second laser, which is an ultrashort pulse laser, onto the display substrate overlapping the sealing area.

In the forming of the nanowire, the nanowire may be formed to protrude from a first surface, which faces the display substrate, of the first surface and a second surface of the encapsulation substrate, which face each other.

In the forming of the nanowire, a focus of the first laser may be disposed on the first surface of the encapsulation substrate.

In the forming of the nanowire, as the first laser is radiated onto the encapsulation substrate, the nanowire may be formed by melting and expanding a portion of the encapsulation substrate.

In the combing of the encapsulation substrate and the display substrate with each other, a focus of the second laser may be disposed inside the display substrate.

In the combing of the encapsulation substrate and the display substrate with each other, a first encapsulation part may be formed between the encapsulation substrate and the display substrate, and as the second laser is radiated onto the display substrate, the first encapsulation part may be formed to be mixed with the nanowire by melting and expanding a portion of the display substrate.

The first encapsulation part may have a width of about 50 μm to about 110 μm.

The first encapsulation part may have a thickness of about 5 μm to about 15 μm.

Output energy of the first laser may be greater than output energy of the second laser.

The providing of the display substrate may include: forming a circuit layer including a plurality of thin film transistors and a plurality of lines on a base layer; and forming a display layer including a plurality of display elements on the circuit layer overlapping the display area.

The non-display area of the display substrate may further include a pad area that does not overlap the encapsulation substrate, wherein, in the combining of the display substrate and the encapsulation substrate with each other, the pad area of the display substrate may be exposed by the encapsulation substrate.

The sealing area may include: a first sealing area defined as a remaining area of an edge area of the non-display area except for an area of the edge area of the non-display area, which is adjacent to the pad area; and a second sealing area defined between the pad area and the display area and connected to the first sealing area, wherein the nanowire may be formed on the first sealing area of the first sealing area and the second sealing area.

The combining of the encapsulation substrate and the display substrate with each other may further include: disposing a second adhesion member on the second sealing area between the encapsulation substrate and the display substrate; and forming a second encapsulation part by radiating a third laser and applying heat the second adhesion member.

The first sealing area may have a width less than a width of the second sealing area.

The third laser may include a CW laser.

The second adhesion member may include glass powder.

The method may further include forming an input sensing layer comprising a plurality of input sensing electrodes on an upper or lower portion of the encapsulation substrate.

Each of the first laser and the second laser may include femtosecond laser.

The providing of the encapsulation substrate may include forming an etching groove in the display area of the encapsulation substrate, wherein the etching groove may be defined in a first surface, which faces the display substrate, of the first surface and a second surface of the encapsulation substrate, which face each other.

In the combining of the encapsulation substrate and the display substrate with each other, as the second laser is radiated, a plurality of bonding parts may be formed between the encapsulation substrate and the display substrate on the sealing area, and an interface between the nanowire and the display substrate within the bonding parts may be discontinuous.

A method for manufacturing a display device according to an embodiment of the present invention include: providing a display substrate and an encapsulation substrate, each of which has a display area and a non-display area surrounding the display area thereon; forming a nanowire on one surface of the encapsulation substrate by radiating a first laser, which is an ultrashort pulse laser, onto a sealing area defined as a partial area of the non-display area of the encapsulation substrate; and radiating a second laser, which is ultrashort pulse laser, to combine the nanowire of the encapsulation substrate with the display substrate, wherein, in the forming of the nanowire, a focus of the first laser is disposed on the one surface of the encapsulation substrate, and in the combining of the encapsulation substrate with the display substrate, a focus of the second laser is disposed inside the display substrate.

BRIEF DESCRIPTION OF THE DRAWINGS

FIG. 1 is a perspective view of an entire display according to an embodiment of the present invention.

DETAILED DESCRIPTION OF THE DRAWINGS

Figure 2:
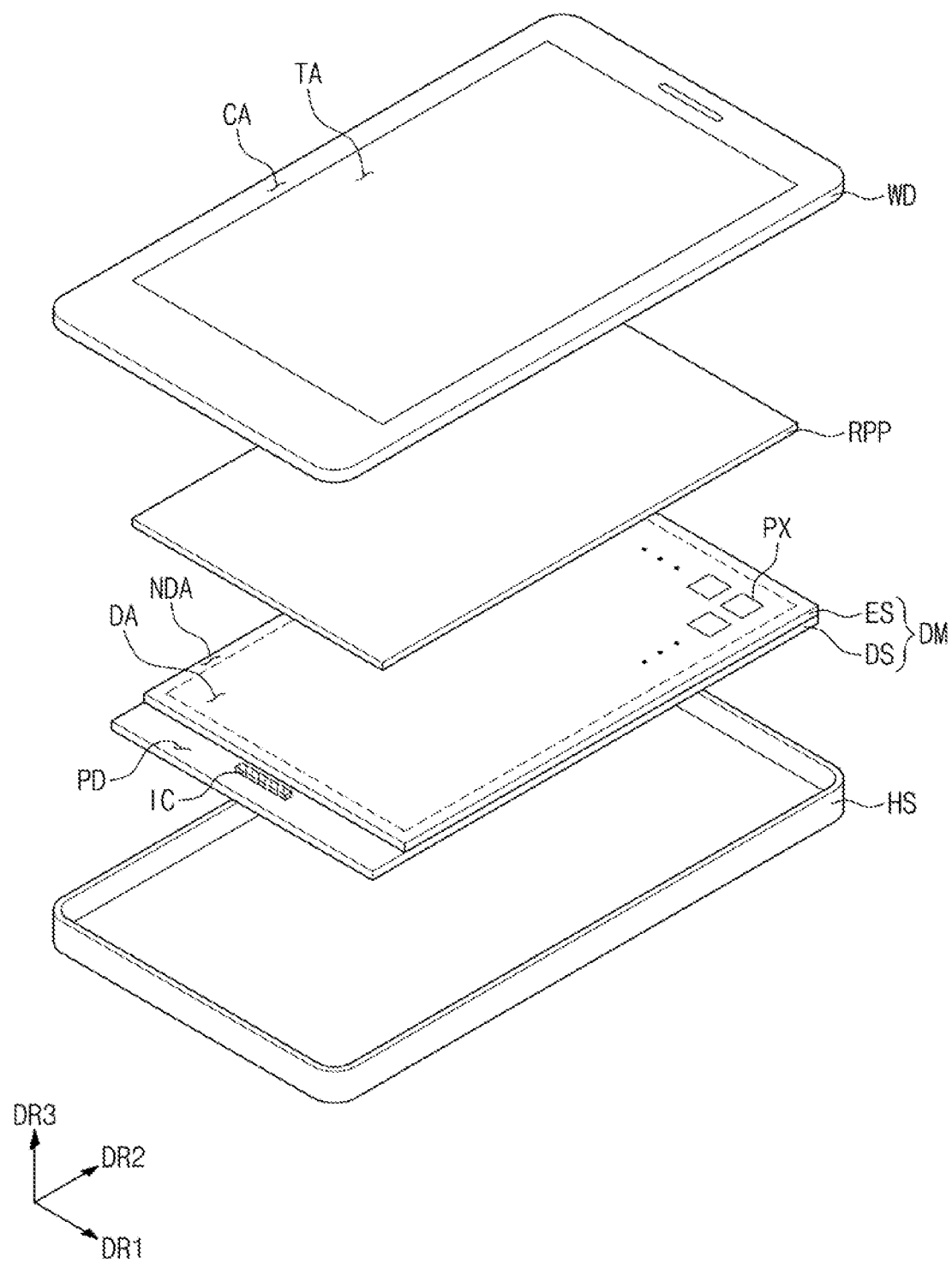
FIG. 2 is an exploded perspective view of the display device of FIG. 1.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals may refer to like elements throughout. Also, in the figures, the thickness, ratio, and dimensions of components may be exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

FIG. 1 is a perspective view of an entire display according to an embodiment of the present invention, and FIG. 2 is an exploded perspective view of the display device of FIG. 1.

Referring to FIGS. 1 to 2, a display device 1000 according to an embodiment of the present invention may be a device that is activated according to an electrical signal. The display device 1000 may include various embodiments. For example, the display device 1000 may include a tablet, a notebook, a computer, a smart television, and the like.

In this embodiment, the display device 1000 provides a display surface that is parallel to each of a first direction DR1 and a second direction DR2 and displays an image IM in a third direction DR3. The display surface on which the image is displayed may correspond to a front surface of the display device 1000.

Referring to FIG. 1, the display device 1000 according to an embodiment of the present invention has a rectangular shape with short sides in the first direction DR1 and long sides in the second direction DR2 crossing the first direction DR1. For convenience of description, the shape of the display device 1000 is merely an example, and the embodiment of the present invention is not particularly limited to the shape of the display device 1000.

As illustrated in FIGS. 1 and 2, the display device 1000 includes a window member WD, a display module DM, and an accommodation member HS.

For convenience of description, only partial constituents of the display device 1000 are selectively illustrated in FIGS. 1 and 2. In addition to the illustrated members, the display device 1000 may further include various constituents such as a power supply module, an optical member, a protection member, a heat dissipation member, and an electronic module including electronic elements, but their illustration and description will be omitted.

The window member WD provides the front surface of the display device 1000 and protects the display module DM. For example, the window member WD may include a glass substrate, a sapphire substrate, or a plastic film. The window member WD may has a single or multilayered structure. For example, the window member WD may have a laminated structure of a plurality of plastic films bonded to each other by using an adhesive or a laminated structure of a glass substrate and a plastic film, which are bonded to each other by using an adhesive.

The front surface of the window member WD may be divided into a light transmission area TA and a light blocking area CA. The light transmission area TA is defined as an area through which the image IM is transmitted. The user visually recognizes the image IM through the transmission area TA.

The light blocking area CA may be adjacent to the light transmission area TA. The light blocking area CA may at least partially surround the light transmission area TA. The light blocking area CA may have a predetermined color. However, this is merely an example, and the light blocking area CA may be disposed to be adjacent to only one side of the light transmission area TA or may be omitted.

A normal direction of the front surface of the display device 1000 corresponds to a thickness direction of the display device 1000. For convenience of explanation, the normal direction of the front surface of the display device 1000, e.g., a direction in which the image is provided from the display device 1000 is defined as an upward direction, and a direction opposite to the upward direction is defined as a downward direction. In this embodiment, the upward and downward directions are parallel to the third direction DR3 that is defined as a direction perpendicular to the first and second directions DR1 and DR2. The third direction DR3 may be a reference direction for dividing front and rear surfaces of components that will be described below. However, the upward direction and the downward direction may be a relative concept and thus be changed in different directions.

The display module DM is disposed below the window member WD. The display module DM displays the image IM.

The display module DM according to an embodiment of the present invention may be an organic electro luminescence display panel. For example, the display module DM according to an embodiment of the present invention may include a plurality of organic light emitting elements. However, the present invention is not particularly limited to the type of display module DM. For example, the display module DM may be a liquid crystal display panel, an electrowetting display panel, a nano-crystal display panel, or a quantum dot light emitting display panel. Hereinafter, in this embodiment, the display module DM is described as an organic light emitting display panel.

In this embodiment, the display module DM may be divided into a display area DA and a non-display area NDA on a plane.

The display area DA is an area on which the image IM is displayed. The display area DA is defined at a center of the display module DM on the plane. For example, the display area DA may overlap the light transmission area TA on the plane.

The display module DM may include a plurality of pixels PX which are disposed on the display area DA and on which light generating the image is displayed. The pixels PX may be arranged in the form of a matrix within the display area DA. The pixels PX emit light according to an electrical signal. This will be described below in detail.

The non-display area NDA is an area on which the image IM is not displayed and has a frame shape surrounding the display area DA. For example, the non-display area NDA may overlap the light blocking area CA on the plane. The non-display area NDA includes a pad area PD defined at an edge of the non-display area NDA. The pad area PD may be an area connected to at least one external element IC. The display substrate DS may be electrically connected to the external device IC through the pad area PD.

Furthermore, the non-display area NDA includes a sealing area. The sealing area will be described in more detail below with respect to FIGS. 3 to 5.

The display device 1000 according to an embodiment of the present invention may further include an anti-reflection member RPP. The anti-reflection member RPP is disposed between the window member WD and the display module DM. The anti-reflection member RPP reduces reflectance of the external light incident from an upper side of the window member WD.

The anti-reflection member RPP according to an embodiment of the present invention may include a retarder and a polarizer. The retarder may be a film type or a liquid crystal coating type and may include a half-wave ($\lambda/2$) retarder and/or a quarter-wave ($\lambda/4$) retarder. The polarizer may also be provided in a film type or liquid crystal coating type polarizer. The film type may include an elongation-type synthetic resin, and the liquid crystal coating type may include liquid crystals that are arranged in a predetermined arrangement. Each of the retarder and the polarizer may further include a protection film. The present invention is not particularly limited to the material of the phase retardation layer PRL.

The accommodation member HS is disposed at the lowermost portion of the display device 1000. For example, in this embodiment, the accommodation member HS is disposed on the rear surface of the display module DM. The accommodation member HS may be coupled to the window member WD to define the rear surface of the display device 1000. The accommodation member HS is coupled to the window member WD to define an inner space and accommodates the anti-reflection member RPP, the display module DM, and various electronic components or optical components in the inner space.

The accommodation member HS may include a material having a high rigidity. For example, the accommodation member HS may include a plurality of frames and/or plates, each of which is made of glass, plastic, and a metal. The accommodation member HS may stably protect the components of the display device 1000 accommodated in the inner space against an external impact.

Figure 3:
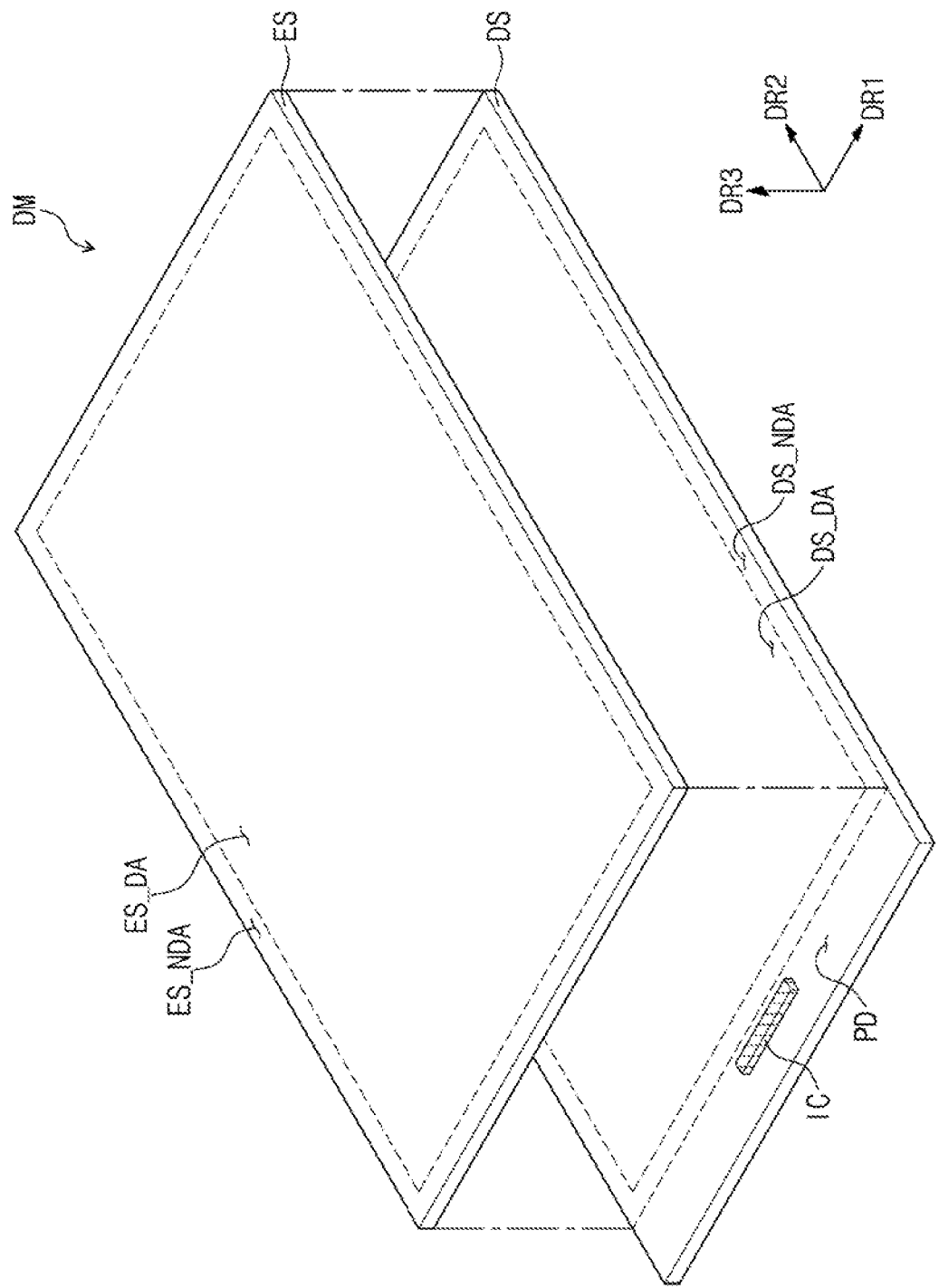
FIG. 3 is an exploded perspective view of a display module of FIG. 2.
Figure 4:
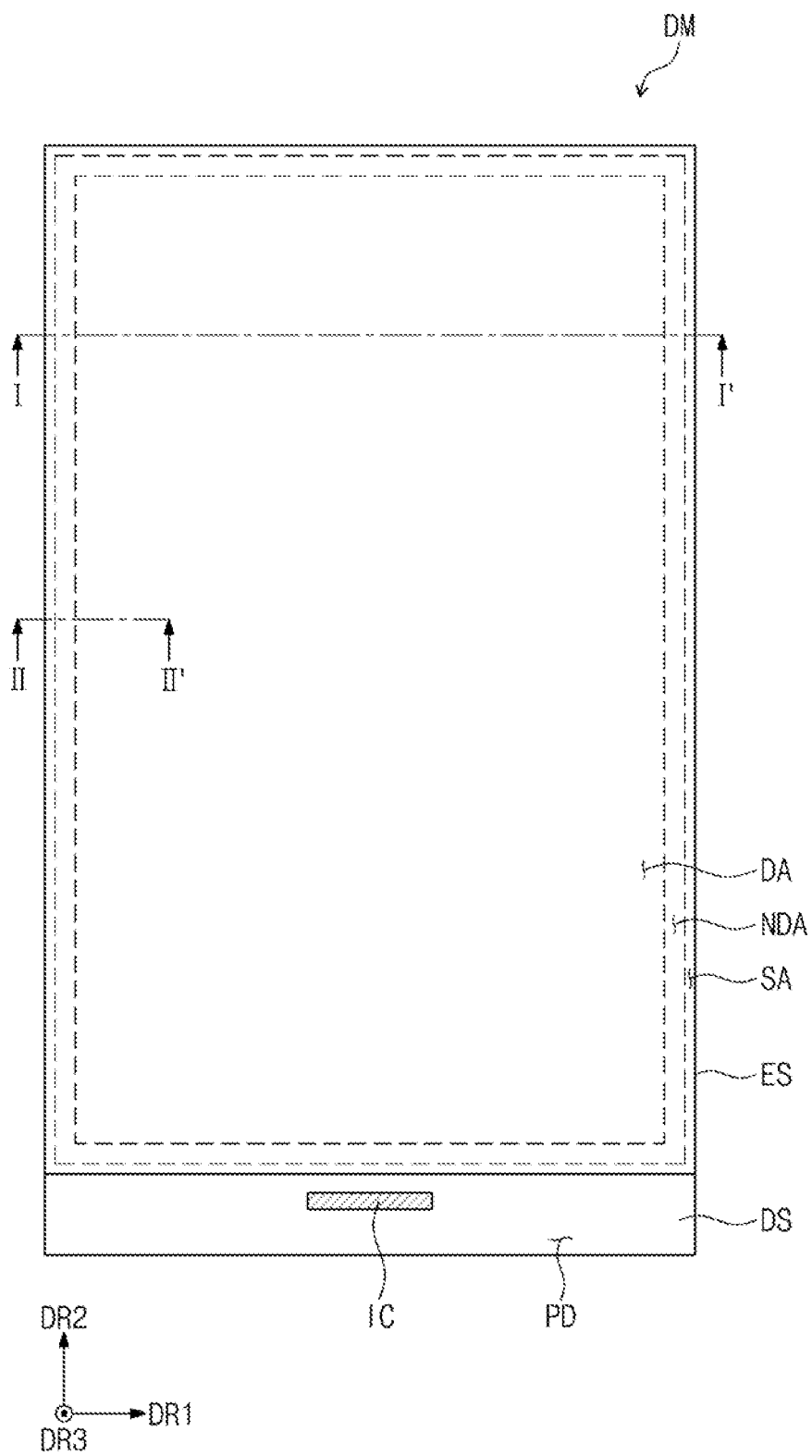
FIG. 4 is a plan view of the display module of FIG. 2.

FIG. 3 is an exploded perspective view of the display module of FIG. 2, and FIG. 4 is a plan view of the display module of FIG. 2.

Referring to FIGS. 3 and 4, the display module DM includes a display substrate DS and an encapsulation substrate ES. In this embodiment, each of the display substrate DS and the encapsulation substrate ES includes a glass material.

The display substrate DS may be provided in a shape that is combined with the encapsulation substrate ES. The display substrate DS includes a plurality of pixels PX (see FIG. 2) disposed on a display area DS_DA on the display substrate DS.

In this embodiment, an area occupied by the display substrate DS on the plane may be greater than that occupied by the encapsulation substrate ES. For example, a length of the long side defined as a length of the display substrate DS in the second direction DR2 may be greater than a length of the long side defined as a length of the encapsulation substrate ES in the second direction DR2. Thus, a partial area of the display substrate DS may be exposed by the encapsulation substrate ES. The exposed area corresponds to the above-described pad area PD. For example, the above-described pad area PD may be defined on the display substrate DS. The pad area PD is defined at one side of the display substrate DS in the second direction DR2.

The non-display area NDA of the display module DM according to this embodiment includes a sealing area SA surrounding the display area DA. The sealing area SA may be defined at the outermost portion of the non-display area NDA. For example, the sealing area SA has a frame shape surrounding four surfaces of the display area DA. The sealing area SA is defined as an area on which the display substrate DS and the encapsulation substrate ES are combined with each other.

According to this embodiment, a width of a dead space of the display device 1000 may be set according to a size of a width of the sealing area SA. The sealing area SA will be defined in more detail with reference to drawings to be described later.

Figure 5:
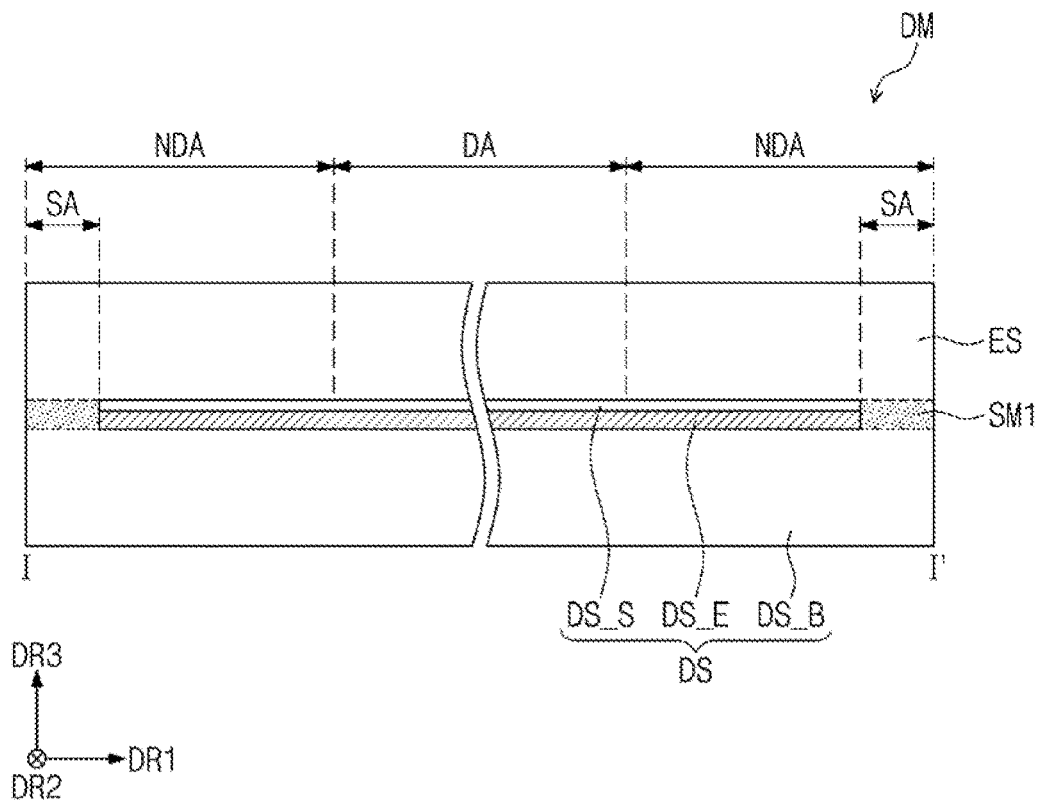
FIG. 5 is a cross-sectional view taken along line I-I' of FIG. 4.
Figure 6:
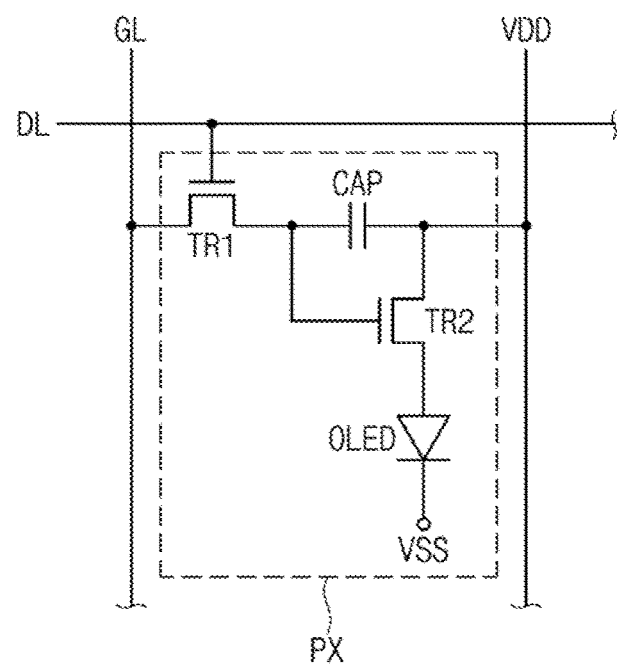
FIG. 6 is an equivalent circuit diagram of one pixel of FIG. 2.
Figure 7:
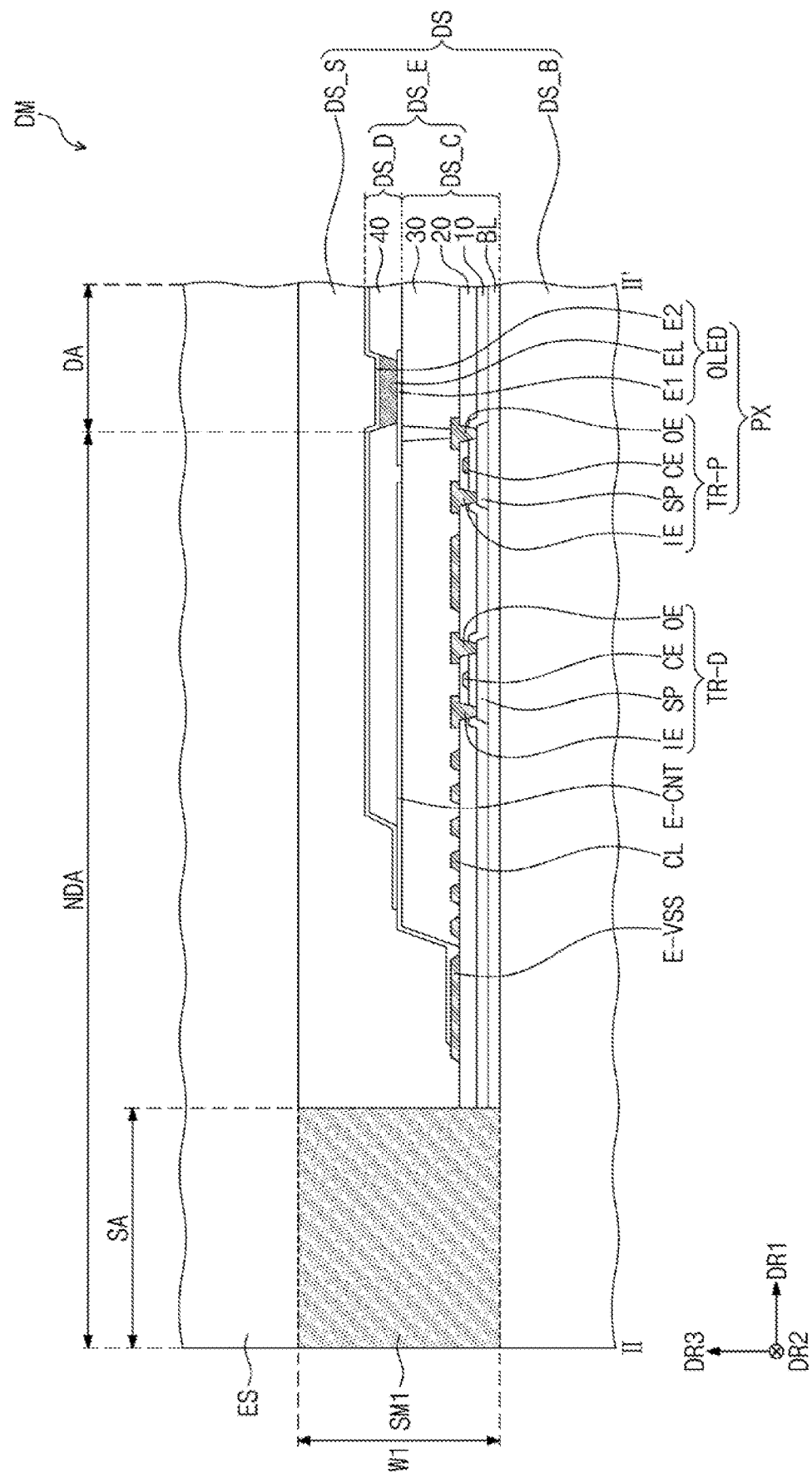
FIG. 7 is a cross-sectional view taken along line II-II' of FIG. 4.

FIG. 5 is a cross-sectional view taken along line I-I' of FIG. 4, and FIG. 6 is an equivalent circuit diagram of one pixel of FIG. 2. FIG. 7 is a cross-sectional view taken along line II-II' of FIG. 4.

For convenience of explanation, FIG. 6 illustrates an equivalent circuit diagram of one pixel PX among the plurality of pixels PX illustrated in FIG. 2. Each of the plurality of pixels PX according to an embodiment of the present invention may have a structure corresponding to the pixel PX illustrated in FIG. 6. Also, constituents of the pixel PX may not be limited to those of FIG. 6, but may be deformable.

Referring to FIGS. 5 to 7, the display substrate DS includes a base layer DS_B and an element layer DS_E. The element layer DS_E is disposed on the base layer DS_B.

In FIGS. 5 and 7, the element layer DS_E is disposed inside the sealing area SA, e.g., disposed within a portion of the non-display area NDA except the sealing area SA and the display area DA. For example, the element layer DS_E may not overlap the sealing area SA. However, the embodiment of the present invention is not limited thereto. In another embodiment of the present invention, the element layer DS_E may overlap at least a portion of the sealing area SA and the pad area PD.

The element layer DS_E includes a circuit layer DS_C and a display layer DS_D. The circuit layer DS_C and the display layer DS_D may include constituents of the pixel PX.

The pixel PX may be disposed on the display area DA. The pixel PX generates light to implement the above-described image IM. The pixel PX may be provided in plural and may be arranged on the display area DA.

The pixel PX may include a first thin film transistor TR1, a capacitor CAP, a second thin film transistor TR2, and a light emitting element OLED. In the present invention, constituents remaining except for the light emitting element OLED, the first thin film transistor TR1, the capacitor CAP, and the second thin film transistor TR2 among the constituents of the pixel PX may be defined as driving elements.

The first thin film transistor TR1 may be a switching element that controls turn-on/off of the pixel PX. The first thin film transistor TR1 may transmit or block the data signal transmitted through the data line DL in response to the gate signal transmitted through the gate line GL.

The capacitor CAP is connected to the first thin film transistor TR1 and the power line VDD. The capacitor CAP charges electrical charge by an amount corresponding to a difference between the data signal received from the first thin film transistor TR1 and a first power voltage applied to the first power line VDD.

The second thin film transistor TR2 is connected to the first thin film transistor TR1, the capacitor CAP, and the light emitting element OLED. The second transistor TR2 controls driving current flowing through the light emitting element OLED to correspond to an amount of charge stored in the capacitor CAP. A turn-on time of the second thin film transistor TR2 may be determined according to the amount of charge in the capacitor CAP. The second thin film transistor TR2 provides the first power voltage transmitted through a power line VDD during the turn-on tune to the light emitting element OLED.

The light emitting element OLED connects the second thin film transistor TR2 to a power terminal VSS. The light emitting element OLED emits light through a voltage corresponding to a difference between a signal transmitted through the second thin film transistor TR2 and the second power voltage received through the power terminal VSS. The light emitting element OLED may emit light during the turn-on time of the second thin film transistor TR2.

The light emitting element OLED includes a luminescent material. The light emitting element OLED may generate light having a color corresponding to the luminescent material. The color of the light generated in the light emitting element OLED may have one of a red color, a green color, a blue color, and a white color.

FIG. 7 illustrates an example of one thin film transistor TR-P (hereinafter, referred to as a pixel transistor) and one light emitting element OLED of the constituents of the pixel PX. The pixel transistor TR-P may correspond to the second thin film transistor TR2 of FIG. 6.

The pixel transistor TR-P together with first to third insulating layers 10, 20, and 30 of a plurality of insulating layers may constitute the circuit layer DS_C. Each of the first to third insulating layers 10, 20, and 30 may include an organic material and/or an inorganic material and have a single layer or multilayered structure. The circuit layer DS_C is disposed on a base layer DS_B.

The base layer DS_B may be an insulating substrate. For example, the base layer BS_B may be a glass substrate.

The circuit layer DS_C according to an embodiment of the present invention may further include a functional layer BL. The functional layer BL may be directly disposed on the base layer DS_B to cover a front surface of the base layer DS_B.

The functional layer BL includes an inorganic material. The functional layer BL may include a barrier layer and/or a buffer layer. Thus, the functional layer BL prevents oxygen or moisture introduced through the base layer DS_B from be permeated into the circuit layer DS_C or the display layer DS_D or allows the circuit layer DS_C to be stably disposed on the base layer DS_B. In this specification, a kind of materials of the functional layer BL is not specifically limited. According to another embodiment of the present invention, the functional layer BL may be omitted.

The pixel transistor TR-P includes a semiconductor pattern SP, a control electrode CE, an input electrode IE, and an output electrode OE. The semiconductor pattern SP is disposed on the base substrate BS. The semiconductor pattern SP may include a semiconductor material. The control electrode CE is spaced apart from the semiconductor pattern SP with a first insulating layer 10 therebetween. The control electrode CE may be connected to one electrode of each of the first thin film transistor TR1 and the capacitor CAP, which are described above.

The input electrode IE and the output electrode OE may be spaced apart from the control electrode CE with the second insulating layer therebetween. The input electrode IE and the output electrode OE of the pixel transistor TR-P may be connected to one side and the other side of the semiconductor pattern SP by passing through the first insulating layer 10 and the second insulating layer 20, respectively.

The third insulating layer 30 may be disposed on the second insulating layer to cover the input electrode IE and the output electrode OE. In the pixel transistor TR-P, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer and be directly connected to the semiconductor pattern SP. The pixel transistor TR-P according to an embodiment of the present invention may have various structures, but is not limited to a specific embodiment.

The light emitting element OLED is disposed on the circuit layer DP-C. The light emitting element OLED may constitute the display layer DP-D together with the fourth insulating layer 40 of the plurality of insulating layers. The light emitting element OLED includes a first electrode E1, an emission layer EL, and a second electrode E2. The fourth insulating layer 40 may include an organic material and/or an inorganic material and have a single layer or multilayered structure.

The first electrode E1 may be connected to the pixel transistor TR-P by passing through the third insulating layer 30. The display substrate DS may further include a separate connection electrode disposed between the first electrode E1 and the pixel transistor TR-P. Here, the first electrode E1 may be electrically connected to the pixel transistor TR-P through the connection electrode.

The fourth insulating layer 40 is disposed on the third insulating layer 30. An opening may be defined in the fourth insulating layer 40. The opening may expose at least a portion of the first electrode E1. The fourth insulating layer 40 may be a pixel defining layer.

The emission layer EL may be disposed in the opening and also disposed on the first electrode E1 exposed by the opening. The emission layer EL may include a light emitting material. For example, the emission layer EL may be made of at least one material that emits light having red, green, and blue colors and include fluorescent material or a phosphorescent material. The emission layer EL may include an organic light emitting material or an inorganic light emitting material. The emission layer EL may emit light in response to a difference in potential between the first electrode E1 and the second electrode E2.

The second electrode E2 is disposed on the emission layer EL. The second electrode E2 may face the first electrode E1. The second electrode E2 mays have an integrated shape that extends from the display area DA to the non-display area NDA. The second electrode E2 may be commonly provided to the plurality of pixels PX. The light emitting element OLED disposed on each of the pixels PX may receive a common power voltage (hereinafter, referred to as a second power voltage) through the second electrode E2.

The second electrode E2 may include a transmissive conductive material or a transflective conductive material. Thus, light generated in the emission layer EL may be easily emitted in the third direction DR3 through the second electrode E2. However, this is merely an example. For example, the light emitting element OLED according to an embodiment of the present invention may be driven in a bottom emission manner including a transmissive or semi-transmissive material or may be driven in a double-side emission manner in which light is emitted from all of the front and rear surfaces, but is not limited to any one embodiment.

The display substrate DS according to an embodiment of the present invention may include a thin film transistor TR-D (hereinafter, referred to as a driving transistor) disposed on the non-display area NDA, and a plurality of signal patterns E-VSS, E-CNT, and CL. The driving transistor TR-D and the signal patterns E-VSS, E-CNT, and CL may constitute the circuit layer DP_C.

The driving transistor TR-D having a structure corresponding to the pixel transistor TR-P is illustrated as an example. For example, the driving transistor TR-D may include a semiconductor pattern SP disposed on the base substrate BSS, a control electrode CE disposed on the first insulating layer 10, an input electrode IE disposed on the second insulating layer 20, and an output electrode OE. Thus, the pixel transistor TR-P and the driving transistor TR-D may be formed through the same process at the same time, and thus, the process may be simplified, and the process cost may be reduced. However, this is merely an example. For example, the driving transistor TR-D according to an embodiment of the present invention may have a structure different from that of the pixel transistor TR-P, but is not limited to any one embodiment.

The signal patterns E-VSS, E-CNT, and CL may include a power supply line E-VSS, a connection electrode E-CNT, and a driving signal line CL. The power supply line E-VSS may correspond to the power terminal of the pixel PX. Thus, the power supply line E-VSS supplies a second power voltage to the light emitting element OLED. In this embodiment, the second power voltages supplied to the pixels PX may be a common voltage with respect to all of the pixels PX.

The power supply line E-VSS may be disposed on the second insulating layer 20 to constitute the circuit layer DS_C. The power supply line E-VSS may be formed through the same process as the input electrode IE or the output electrode OE of the driving transistor TR-D. However, this is merely an example. For example, the power supply line E-VSS may be disposed on a layer that is different from that of the input electrode IE and the output electrode OE of the driving transistor TR-D and thus be formed through a separate process, but is not limited to a specific embodiment.

The connection electrode E-CNT may be disposed on the third insulating layer 30 to constitute the display layer DS_D. The connection electrode E-CNT is electrically connected to the power supply line E-VSS. The connection electrode E-CNT may extend from a top surface of the third insulating layer 30 to cover a top surface of the power supply line E-VSS exposed from the third insulating layer 30.

The second electrode E2 of the light emitting element OLED extends from the active area AA and is connected to the connection electrode E-CNT. The connection electrode E-CNT may receive the second power voltage from the power supply line E-VSS. Thus, the second power voltage may be transmitted to the second electrode E2 through the connection electrode E-CNT and be provided to each of the pixels.

The connection electrode E-CNT may be disposed on the same layer as the first electrode E1 of the light emitting element OLED and thus be formed at the same time with the first electrode E1. However, this is merely an example. For example, the connection electrode E-CNT and the first electrode E1 may be disposed on layers different from each other.

The driving signal line CL may be provided in plural and disposed on the second insulating layer 20. The driving signal line CL may be disposed on the non-display area NDA. The driving signal line CL may be a routing line connected to a pad or a line constituting an integrated circuit. The driving signal lines CL may be disposed to be spaced apart from each other in the first direction DR1 to independently transmit electrically signals.

The encapsulation substrate ES may include an insulating substrate. For example, the encapsulation substrate ES may be provided in the form of an organic substrate.

The encapsulation substrate ES according to an embodiment of the present invention may further include a plurality of color filters disposed on the glass substrate and a black matrix adjacent to the plurality of color filters.

The display module DM according to this embodiment further includes a filling layer CHL. The filling layer CHL is disposed in a spaced space between the element layer DS_E and the encapsulation substrate ES. For example, the filling layer CHL may include an inert gas. The filling layer CHL prevents foreign substances existing between the element layer DS_E and the encapsulation substrate ES from being diffused.

The display module DM according to this embodiment further includes a first encapsulation part SM1 disposed on the sealing area SA. The display substrate DS and the encapsulation substrate ES may be combined with each other by the first encapsulation part SM1. The first encapsulation part SM1 may include a glass material. For example, the first encapsulation part SM1 includes the same material as each of the base layer DS_B and the encapsulation substrate ES of the display substrate DS.

The first encapsulation part SM1 according to this embodiment has a predetermined width and thickness.

For example, the first encapsulation part SM1 has a first thickness W1 in the third direction DR3. In this embodiment, the first thickness W1 may correspond to a distance between the display substrate DS and the encapsulation substrate ES on the sealing area SA. For example, the first thickness W1 may range of about 5 μm to about 15 μm. Also, the first encapsulation part SM1 has a first width in the first direction DR1 or the second direction DR2. In this embodiment, the first width corresponds to a width of the sealing area SA. For example, the first width may range of about 50 μm to about 110 μm.

Figure 8:
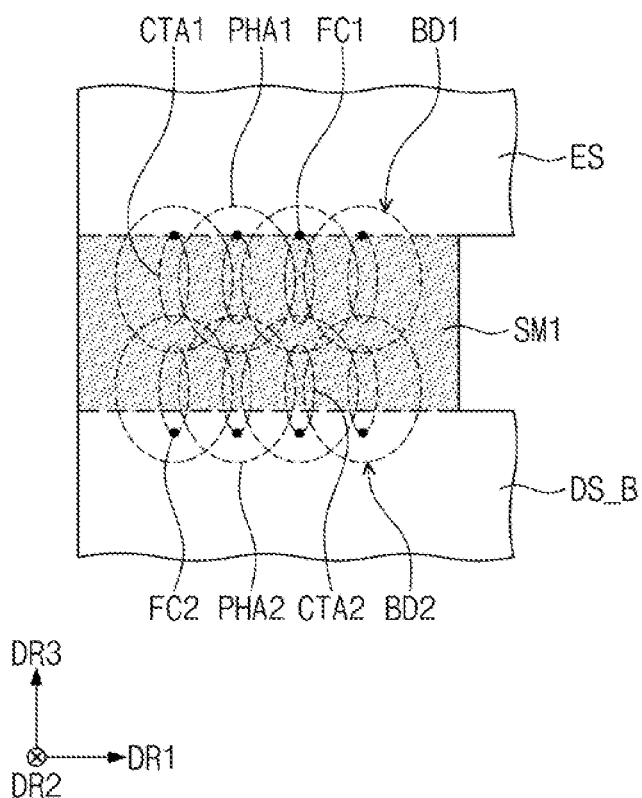
FIG. 8 is a cross-sectional view of a first encapsulation part according to an embodiment of the present invention.

FIG. 8 is a cross-sectional view of the first encapsulation part according to an embodiment of the present invention.

Referring to FIG. 8, the first encapsulation part SM1 according to an embodiment of the present invention may be provided in a shape in which each of a portion of the display substrate DS and a portion of the encapsulation substrate ES is melted and expanded. Thus, an interface between the first encapsulation part SM1 and the display substrate DS and an interface between the first encapsulation part SM1 and the encapsulation substrate ES may be discontinuous.

For example, the first encapsulation part SM1 may include a plurality of first bonding parts BD1 and second bonding parts BD2. Each of the first and second bonding parts BD1 and BD2 has a spherical shape. However, according to the present invention, the shape of each of the first and second bonding parts BD1 and BD2 is not particularly limited. For example, in another embodiment of the present invention, only a portion of each of the first and second bonding parts BD1 and BD2 may have a round shape in cross-section.

The first bonding part BD1 is disposed to cross the interface between the first sealing part SM1 and the encapsulation substrate ES, and the second bonding part BD2 is disposed to cross the interface between the first sealing part SM1 and the display substrate DS. Each of the first and second bonding parts BD1 and BD2 may have a width of about 50 µm about to 100 µm.

For example, an area on which each of the first bonding parts BD1 is disposed is defined as a first bonding area. The first bonding areas are defined inside the sealing area SA. In each of the first bonding areas, the interface between the encapsulation substrate ES and the first encapsulation part SM1 may be discontinuous.

Also, an area on which each of the second bonding parts BD2 is disposed is defined as a second bonding area. The second bonding areas are defined inside the sealing area SA. In each of the second bonding areas, the interface between the base layer DS_B of the display substrate DS and the first encapsulation part SM1 may be discontinuous.

According to this embodiment, the first bonding parts BD1 and the second bonding parts BD2 may be provided by an ultrashort pulse laser. For example, the ultrashort pulse laser may be a femtosecond laser. The femtosecond laser refers to a laser having a wavelength of a unit of a femto second.

For example, as the ultrashort puke laser having a first focus FC1 may be radiated onto a surface of the encapsulation substrate ES, the first bonding part BD1 may be provided. Each of the first bonding parts BD1 includes a first central portion CTA1 and a first peripheral portion PHA1. The first peripheral portion PHA1 has a shape surrounding the first central portion CTA1.

The first central portion CTA1 corresponds to an area on which the first focus FC1 is disposed and has a shape extending in the third direction DR3 from the area on which the first focus FC1 is disposed. The first central portion CTA1 may be defined as an area on which ultrashort pulse energy is concentrated among the areas occupied by the first bonding part BD1 to have a maximum energy absorption amount.

The first central portion CTA1 has an oval shape having a long axis in the third direction DR3 in the cross-section. The long axis may have a length of about 10 µm to about 20 µm. In this embodiment, the first central portion CTA1 has the oval shape, but the present invention is not particularly limited to the shape of the first central portion CTA1. For example, in another embodiment of the present invention, the first central portion CTA1 may have a circular shape, a water droplet shape, or a polygonal shape in the cross-section.

Also, as the ultrashort pulse laser having the second focus FC2 is radiated onto an inner area adjacent to the surface of the display substrate DS, the second bonding part BD2 may be provided. Each of the second bonding parts BD2 includes a second central portion CTA2 and a second peripheral portion PHA2. The second peripheral portion PHA2 has a shape surrounding the second central portion CTA2.

The second central portion CTA2 corresponds to an area on which the second focus FC2 is disposed and has a shape extending in the third direction DR3 from the area on which the second focus FC2 is disposed. The second central portion CTA2 may be defined as an area on which ultrashort pulse energy is concentrated among the areas occupied by the second bonding part BD2 to have a maximum energy absorption amount.

The second central portion CTA2 has an oval shape having a long axis in the third direction DR3 in the cross-section. The long axis may have a length of about 10 µm to about 20 µm. In this embodiment, the second central portion CTA2 has the oval shape, but the present invention is not particularly limited to the shape of the second central portion CTA2. For example, in another embodiment of the present invention, the second central portion CTA2 may have a circular shape, a water droplet shape, or a polygonal shape in the cross-section.

In this embodiment, a portion of each of the first bonding parts BD1 and a portion of each of the second bonding parts BD2 may overlap the adjacent bonding parts BD1 and BD2.

According to this embodiment, when the encapsulation substrate ES and the display substrate DS are bonded to each other by using the ultrashort pulse laser, the sealing substrate ES and the display substrate DS non-linearly absorb energy to provide the bonding parts BD1 and BD2. For example, in the first bonding part BD1 and the second bonding part BD2, since a portion of each of the base layer DS_B and the encapsulation substrate ES is melted and expanded so as to be mixed with each other, bonding strength between the display substrate DS and the encapsulation substrate ES may increase. For example, the bonding strength may be about 18 kgf or more. Thus, according to this embodiment, durability of the display device 1000 may be increased.

Also, according to an embodiment of the present invention, the first bonding parts BD1 and the second bonding parts BD2 overlap each other. Accordingly, since the first bonding parts BD1 provided as a portion of the encapsulation substrate ES is mixed with the second bonding parts BD2 provided as a portion of the display substrate DS, the encapsulation substrate ES and the display substrate DS in the sealing area SA may have an integrated shape without distinction of the interface therebetween. Therefore, the durability may be further increased. In this case, even if the width of the sealing area SA is reduced, the display substrate DS and the encapsulation substrate ES may not be delaminated or damaged. As described above, the sealing area SA according to this embodiment may have a width of about 50 µm to about 110 µm. Thus, according to an embodiment of the present invention, the dead space of the display device 1000 may be reduced.

Figure 9:
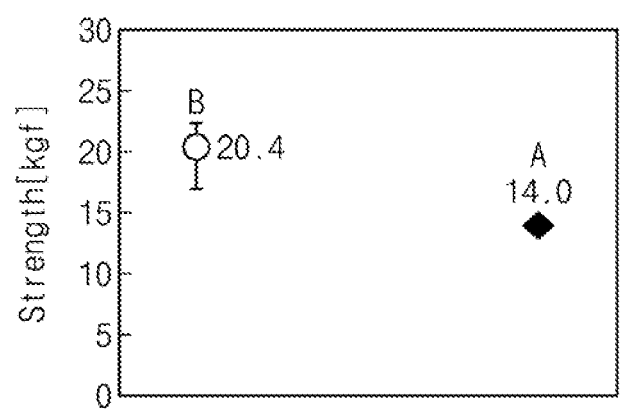
FIG. 9 is a graph illustrating bonding strength between the display substrate and the encapsulation substrate according to an embodiment of the present invention.

FIG. 9 is a graph illustrating the bonding strength between the display substrate and the encapsulation substrate according to an embodiment of the present invention.

A reference symbol A illustrated in FIG. 9 represents bonding strength between the display substrate DS and the encapsulation substrate ES when the display substrate DS and the encapsulation substrate ES are bonded to each other by using a separate adhesion member, unlike the foregoing embodiment of the present invention. In this case, the width of the sealing area SA may be about 600 µm, and the bonding strength may be about 14 kgf. The adhesion member may be an adhesion member including a glass material. For example, the adhesion member may include a frit.

A reference symbol B illustrated in FIG. 9 represents bonding strength between the display substrate DS and the encapsulation substrate ES according to an embodiment of the present invention. According to an embodiment of the present invention, the width of the sealing area SA may be about 50 µm to about 110 µm. As a result, when compared to a first comparative example, the width may decrease, and the bonding strength may increase. As illustrated in FIG. 9, the bonding strength between the display substrate DS and the encapsulation substrate ES according to an embodiment of the present invention may be about 20.4 kgf.

Figure 10:
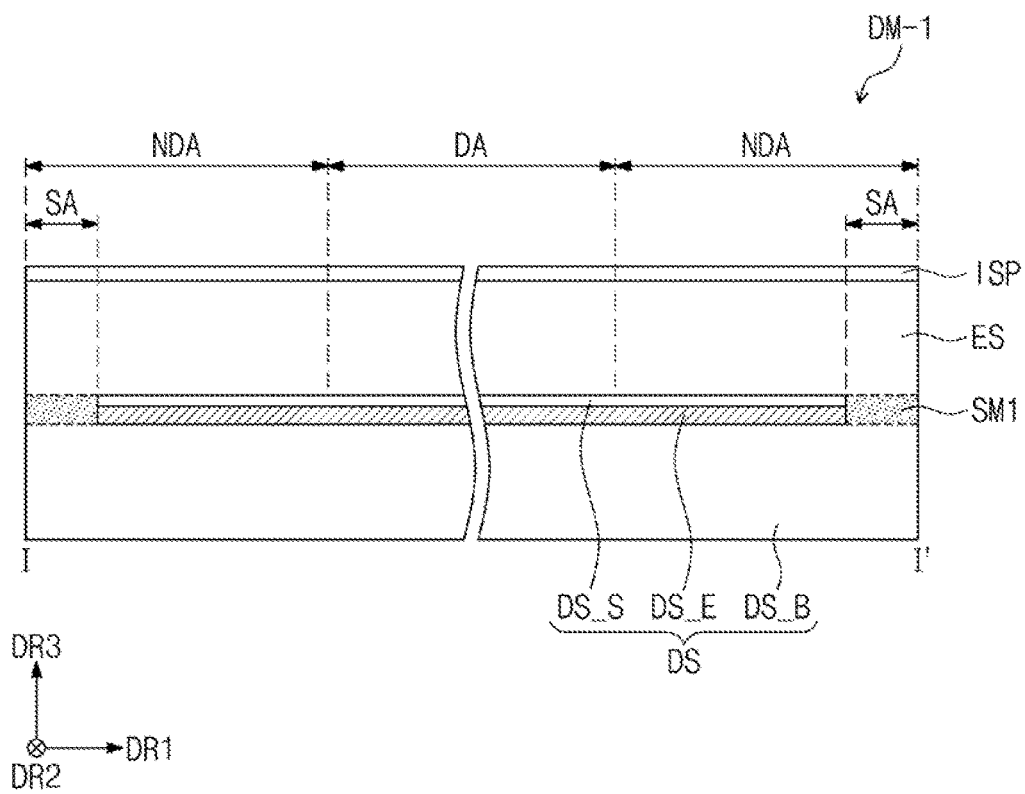
FIG. 10 is a cross-sectional view of a display module according to another embodiment of the present invention.

FIG. 10 is a cross-sectional view of a display module according to as other embodiment of the present invention.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 10, a display module DM-1 according to another embodiment of the present invention may further include an input sensing layer ISP. For example, the display module DM-1 according to this embodiment may sense an external input. An input signal may include various types of inputs provided from the outside of the display device. For example, the input signal includes various types of external inputs such as a portion of the user's body, light, heat, or a pressure. In this embodiment, the input signal may be a touch signal.

In this embodiment, the input sensing layer ISP is disposed on an encapsulation substrate ES to face a display substrate DS with the encapsulation substrate ES therebetween. The input sensing layer ISP may entirely overlap an entire area of the display module DM-1 on a plane. In this case, the input sensing layer ISP may sense an input signal applied to an entire surface of a display area DA and a non-display area NDA. The input sensing layer ISP may include a plurality of input sensing electrodes.

However, this is limited to one embodiment, and in another embodiment of the present invention, the input sensing layer ISP may overlap only at least a partial area of the display module DM-1.

Figure 11:
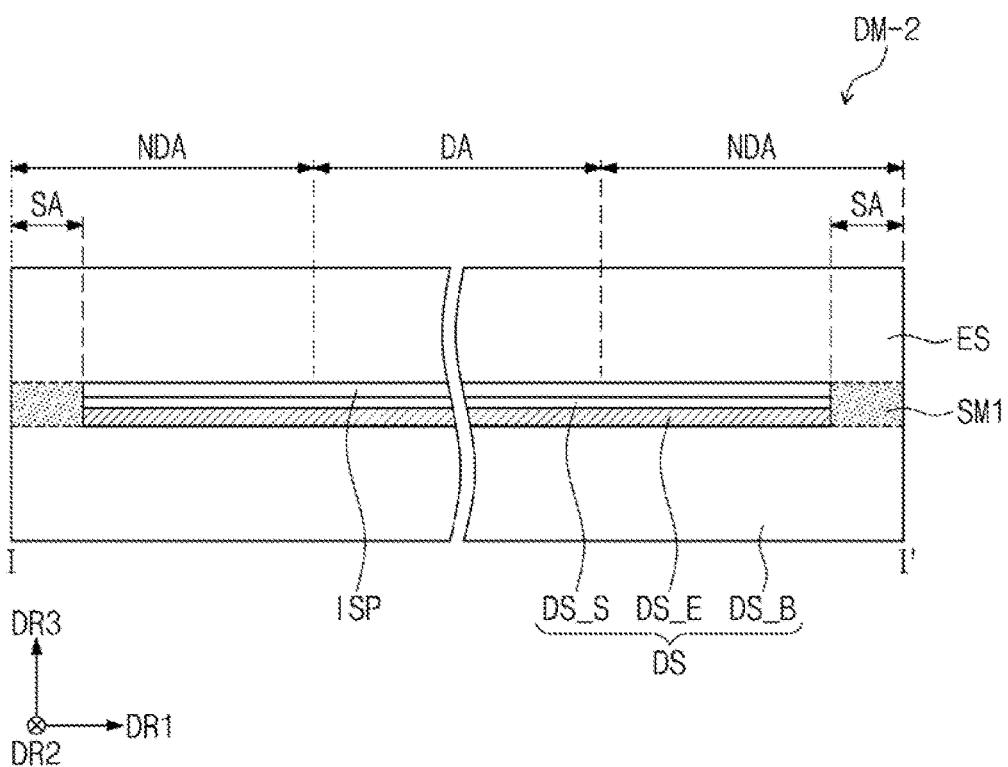
FIG. 11 is a cross-sectional view of a display module according to another embodiment of the present invention.

FIG. 11 is a cross-sectional view of a display module according to another embodiment of the present invention.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 11, a display module DM-2 according to another embodiment of the present invention includes an input sensing layer ISP. Since a function of the input sensing layer ESP is the same as that of the input sensing layer ISP described with reference to FIG. 10, descriptions thereof will be omitted.

In this embodiment, the input sensing layer ISPs disposed between an encapsulation substrate ES and a display substrate DS. For example, the input sensing layer ISP may be disposed on a first surface SS1, which faces the display substrate DS, of the first surface SS1 and a second surface SS2 of the encapsulation substrate ES, which face each other, to constitute one laminate together with the encapsulation substrate ES. The above-described filling layer CHL may be disposed between the input sensing layer ISP and the encapsulation substrate ES.

The input sensing layer ISP according to this embodiment may overlap areas except for a sealing area SA. In this case, the input sensing layer ISP may sense an it put signal applied to a display area DA and an input signal applied to a non-display area NDA except for the sealing area SA.

The present invention is not limited to the position of the input sensing layer ISP. The input sensing layer ISP according to another embodiment of the present invention may be disposed on an element layer DS-E of the display substrate DS to form one laminate together with the display substrate DS. In this case, the above-described filling layer CHL may be disposed between the input sensing layer ISP and the encapsulation substrate ES.

Figure 12:
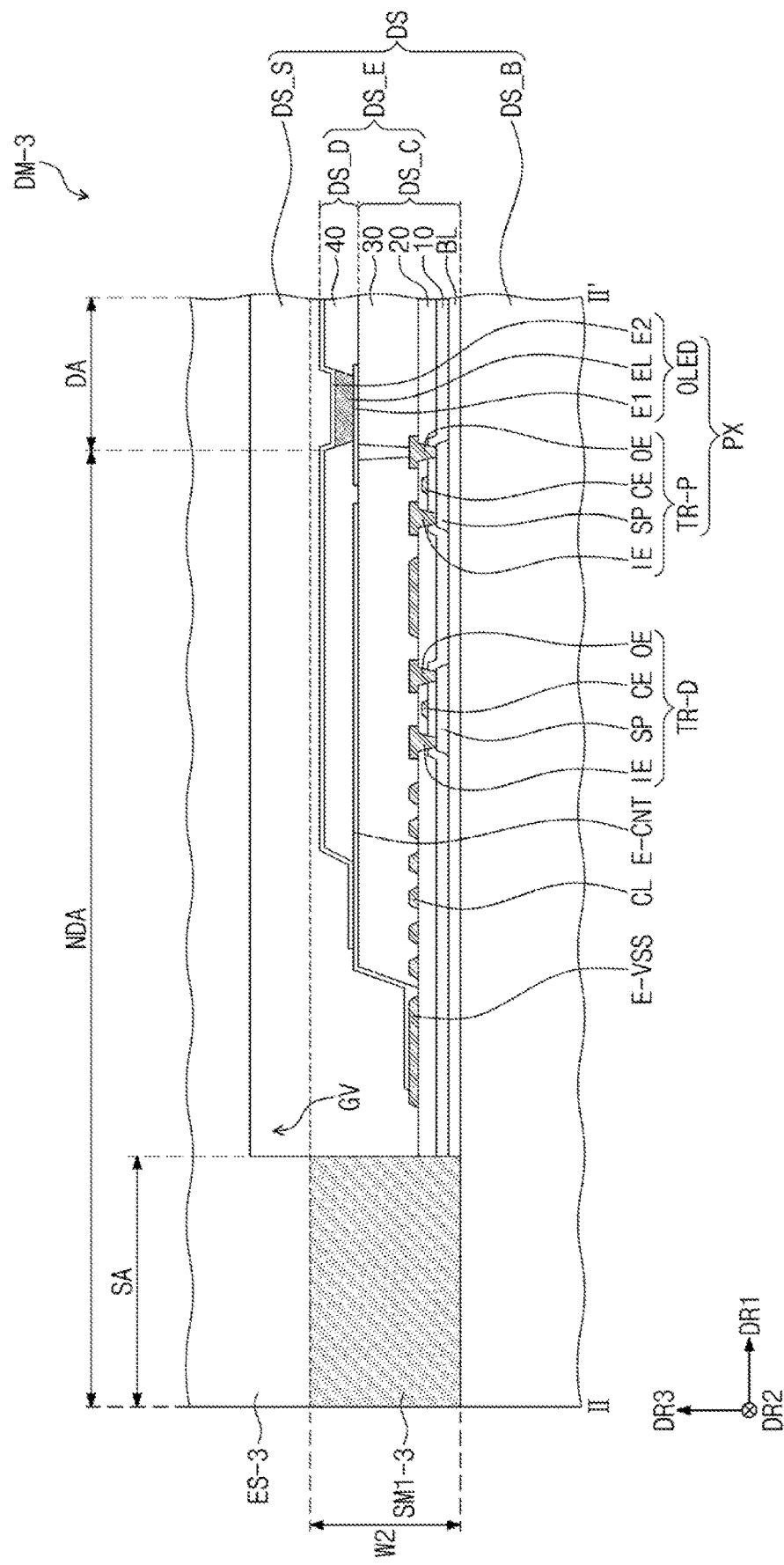
FIG. 12 is a cross-sectional view of a display module according to another embodiment of the present invention.

FIG. 12 is a cross-sectional view of a display module according to another embodiment of the present invention.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 12, an encapsulation substrate ES-3 of a display module DM-3 according to another embodiment of the present invention includes an etching groove GV recessed from a first surface SS1 in the third direction DR3. The etching groove GV is defined in an area of the first surface of the encapsulation substrate ES-3 except for a sealing area SA. For example, according to this embodiment, a thickness of the encapsulation substrate ES on the sealing area SA may be greater than that out each of a non-display area NDA and a display area DA except for the sealing area SA. In this embodiment, a depth of the etching groove GV may be about 5 µm or less.

According to this embodiment, a first encapsulation part SM1-3 has a second thickness W2. The second thickness W2 may be less than the first thickness W1 of the first encapsulation part SM1 described with reference to FIG. 7. For example, the second thickness W2 may be about 10 µm or less.

According to this embodiment, even if the thickness of the first encapsulation part SM1-3 is small, a spaced distance between the display substrate DS and the encapsulation substrate ES may be maintained. For example, the spaced distance between the display substrate DS and the encapsulation substrate ES may be maintained, but the thickness of the first encapsulation part SM1-3 may be reduced. As a result, changes in state of the encapsulation substrate ES and the display substrate DS, which provide the first encapsulation part SM1-3, may be reduced. For example, durability of the display module DM-3 may be more increased.

Figure 13:
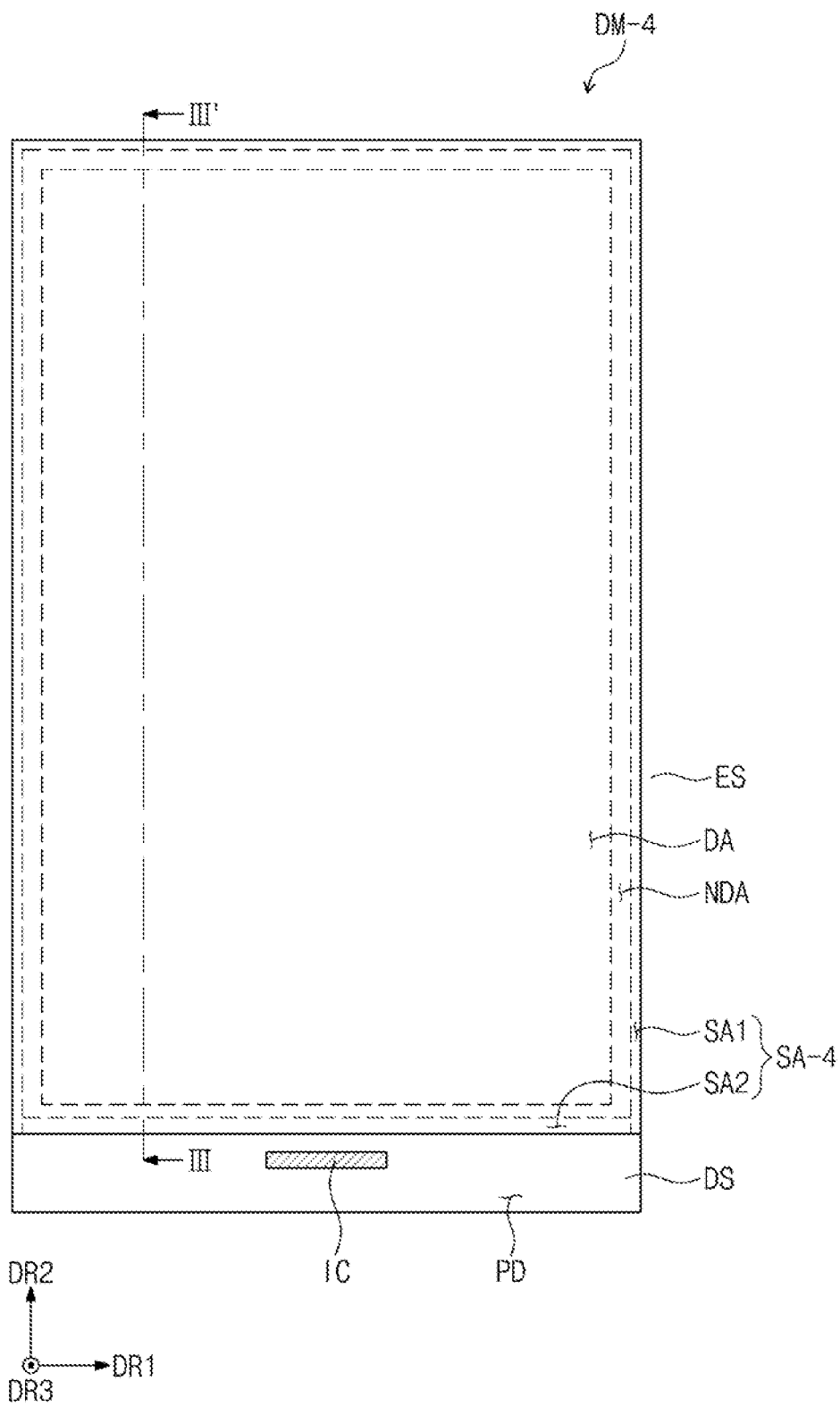
FIG. 13 is a plan view of a display module according to another embodiment of the present invention.
Figure 14:
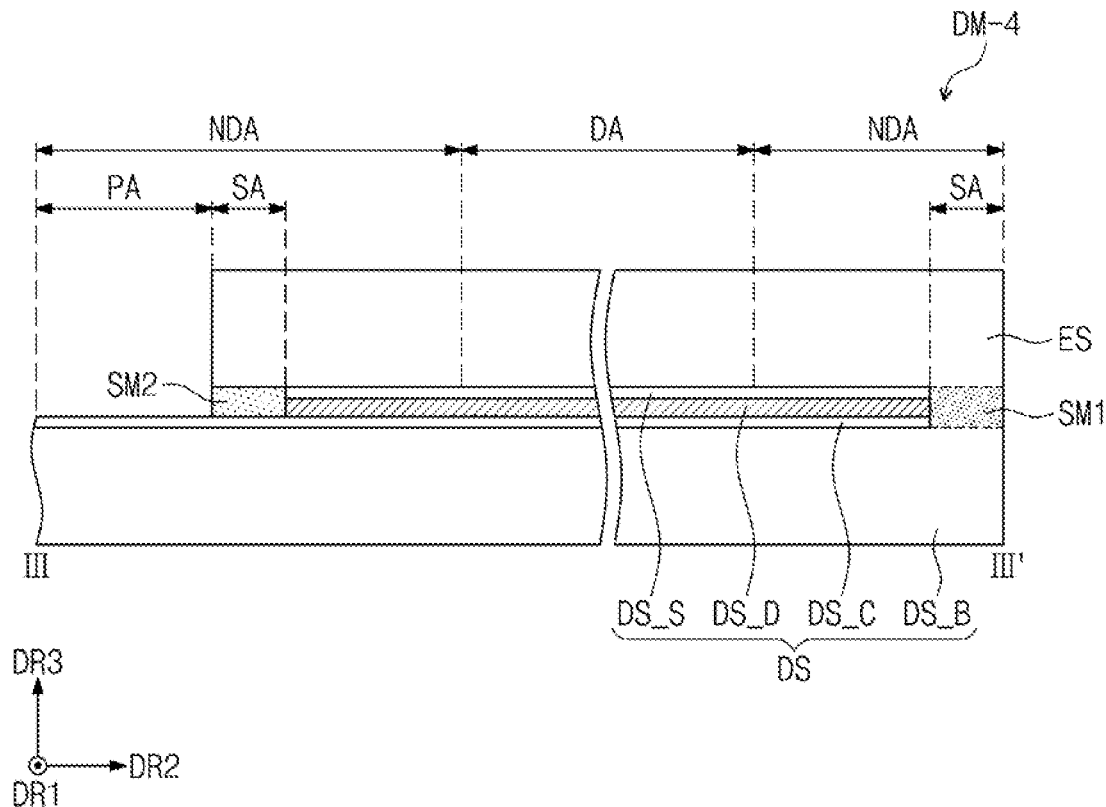
FIG. 14 is a cross-sectional view taken along line III-III' of FIG. 13.

FIG. 13 is a plan view of a display module according to another embodiment of the present invention, and FIG. 14 is a cross-sectional view taken along line III-III' of FIG. 13.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIGS. 13 and 14, a sealing area SA-4 of a display module DM-4 according to another embodiment of the present invention includes a first sealing area SA1 and a second sealing area SA2.

In this embodiment, the first sealing area SA1 is defined as an area of the sealing area SA except for an area of the sealing area SA, which is adjacent to a pad area PD. For example, the first sealing area SA1 may be defined to surround three side surfaces of four side surfaces of a display area DA, and the second sealing area SA2 may be defined between the display area DA and the pad area PD. The first sealing area SA1 and the second sealing area SA2 are connected to each other.

According to this embodiment, the second sealing area SA2 may have a width greater than or equal to that of the first sealing area SA1. When the first sealing area SA1 has the first width described above, the width of the second sealing area SA2 may be greater than or equal to the first width.

The display module DM-4 according to this embodiment further includes a second encapsulation part SM2. The second encapsulation part SM2 is disposed between a display substrate DS and an encapsulation substrate ES, which overlap the second sealing area SA2. The second encapsulation part SM2 may be an adhesion member made of a glass material. For example, the second encapsulation part SM2 may be a solid adhesion member that is a deformed frit.

In this embodiment, the second encapsulation part SM2 does not include the above-described bonding parts BD1 and BD2. For example, an interface between the second encapsulation part SM2 and the encapsulation substrate ES and an interface between the second encapsulation part SM2 and the display substrate DS may be continuous.

According to this embodiment, a circuit layer DS_C of the display substrate DS may be disposed to extend up to the second sealing area SA2 and the pad area PD. For example, the circuit layer DS_C may overlap an entire area on the display substrate DS except for the first sealing area SA1. In this case, the second encapsulation part SM2 is disposed between the circuit layer DS-C and the encapsulation substrate ES.

According to this embodiment, a phenomenon in which lines of the circuit layer DS_C disposed on the pad area PD of the second sealing area SA2 are damaged by a femtosecond laser having a high energy may be prevented from occurring.

In this embodiment, when the constituents of the encapsulation substrate ES, which are described with reference to FIG. 12, are applied, an etching groove GV described above may overlap the second sealing area SA2. For example, the etching groove GV may be defined in an area on the encapsulation substrate ES except for the first sealing area SA1.

Figure 15:
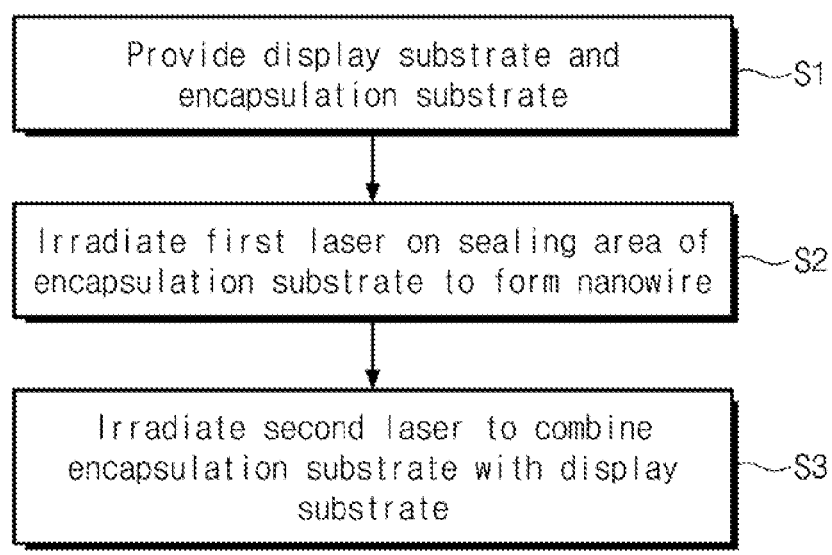
FIG. 15 is a flowchart illustrating a method for manufacturing a display device according to an embodiment of the present invention.

FIG. 15 is a flowchart illustrating a method for manufacturing a display device according to an embodiment of the present invention, and FIGS. 16 to 22 are views illustrating a process of manufacturing a display device according to an embodiment of the present invention.

A method of manufacturing a display device disclosed in drawings to be described later relates to a method of manufacturing a display module of the display device, and for convenience of explanation, a method of manufacturing other components except for the display module will be omitted.

Referring to FIG. 15, a method of manufacturing a display device according to an embodiment of the present invention includes a process (S1) of providing a display substrate DS and an encapsulation substrate ES, a process (S2) of forming a nanowire on a sealing area SA of the encapsulation substrate ES, and a process (S3) of combining the encapsulation substrate ES with the display substrate DS.

Hereinafter, the method of manufacturing the display device according to an embodiment will be described in more detail below with reference to FIGS. 16 to 22 together with FIG. 15.

Figure 16:
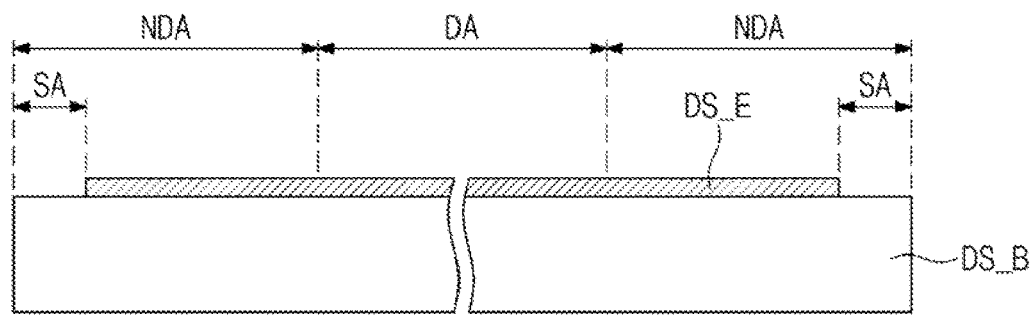
FIGS. 16 to 22 are views illustrating a process of manufacturing a display device according to an embodiment of the present invention.

First, as illustrated in FIG. 16, the process (S1) of providing the display substrate includes a process of forming an element layer DS_E on a base layer DS_B. The process of forming the element layer may include a process of forming a circuit layer DS_C (see FIG. 7) on the base layer DS_B and a process of forming a display layer DS_D (see FIG. 7) on the circuit layer DS_C. In this embodiment, the element layer DS_E may be disposed on a non-display area NDA and a display area DA except for the sealing area SA on the base layer DS_B.

Figure 17:
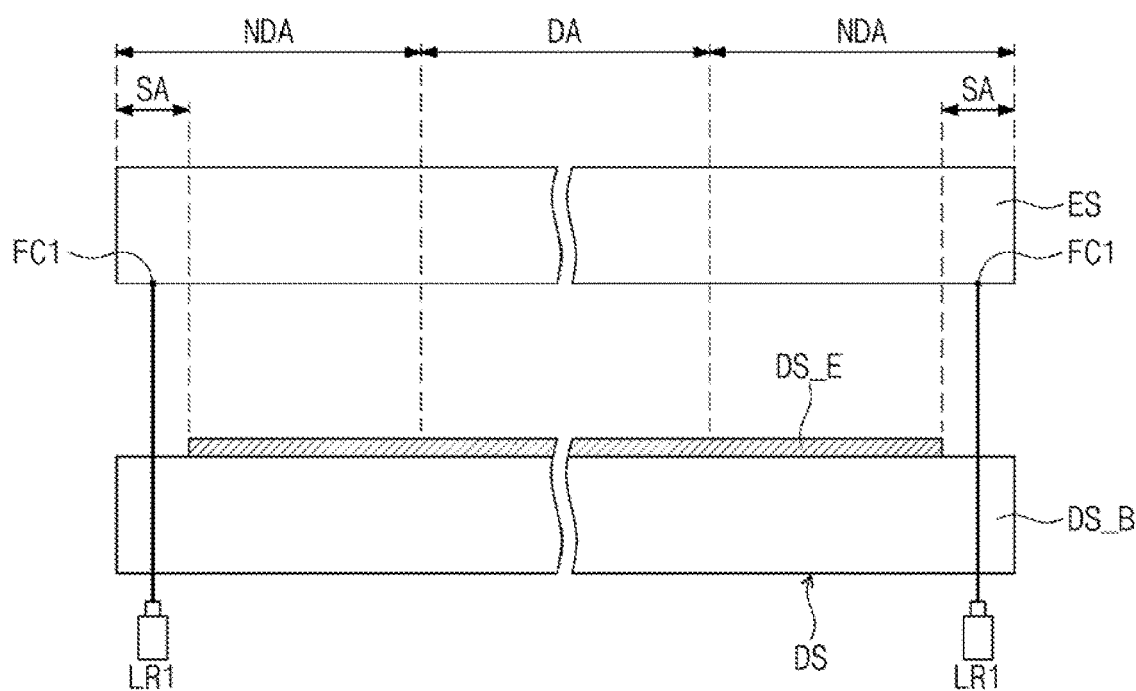

As illustrated FIG. 17, the encapsulation substrate ES is provided (S2). Thereafter, a first laser LR1 is radiated onto the sealing area SA on the encapsulation substrate ES. The first laser LR1 may be an ultrashort pulse laser. For example, the first laser LR1 may be a femtosecond laser. A first focus FC1 defined as a focus of the first laser LR1 is disposed on a first surface SS1, which faces the base layer DS_B, of the first surface SS1 and a second surface SS2 of the encapsulation substrate ES. The first focus FC1 may be disposed on a plurality of areas. For example, the first focus FC1 of the first laser LR1 may move on the first surface SS1 overlapping the sealing area SA.

The first surface SS1 and the second surface SS2 face each other. In FIG. 17, a direction in which the first laser LR1 oscillates is parallel to a direction from the base layer BS_B toward the first surface SS1 of the encapsulation substrate ES.

Figure 18:
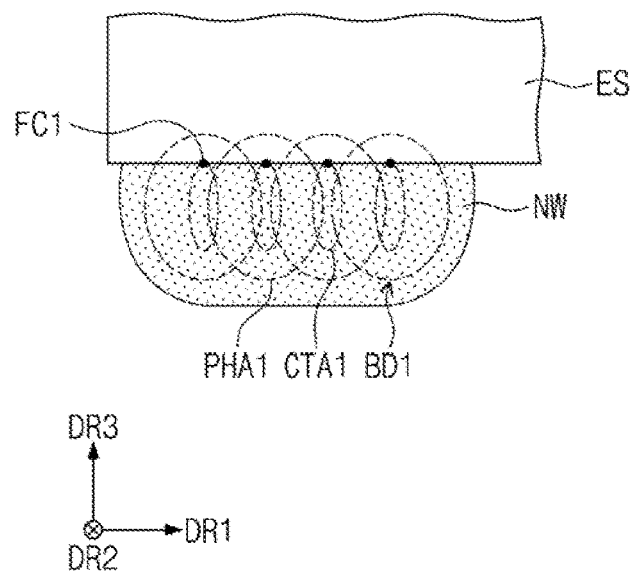

FIG. 18 is an enlarged cross-sectional view of a nanowire NW according to an embodiment of the present invention. As illustrated in FIG. 18, as the first laser LR1 is radiated onto the encapsulation substrate ES, the nanowire NW may be formed on the sealing area SA. The nanowire NW is formed to protrude from the first surface SS1 toward the base layer DS_B. A thickness of the nanowire NW in the third direction DR3 may be greater than a maximum thickness of the element layer DS_E of the display substrate DS.

According to this embodiment, the nanowire NW may be formed by melting and expanding a portion of the encapsulation substrate ES. For example, the nanowire NW includes a plurality of first bonding parts BD1. Each of the first bonding parts BD1 is formed to protrude from a point, at which the first focus FC1 is disposed, toward the base layer DS_B.

Figure 19:
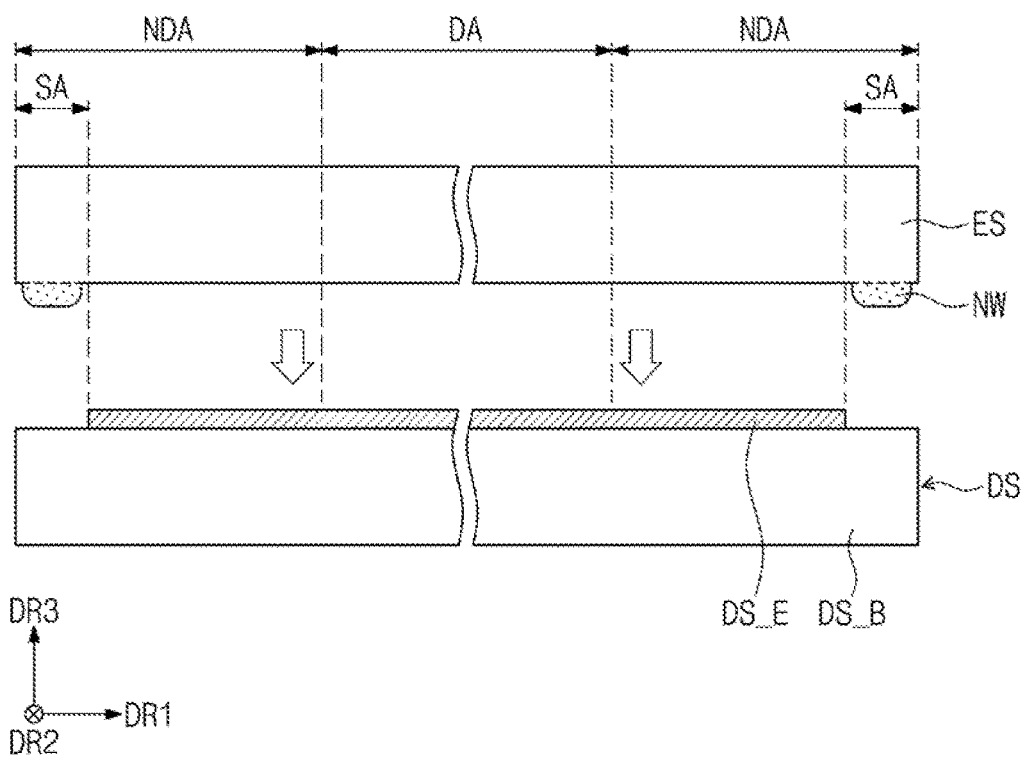
Figure 20:
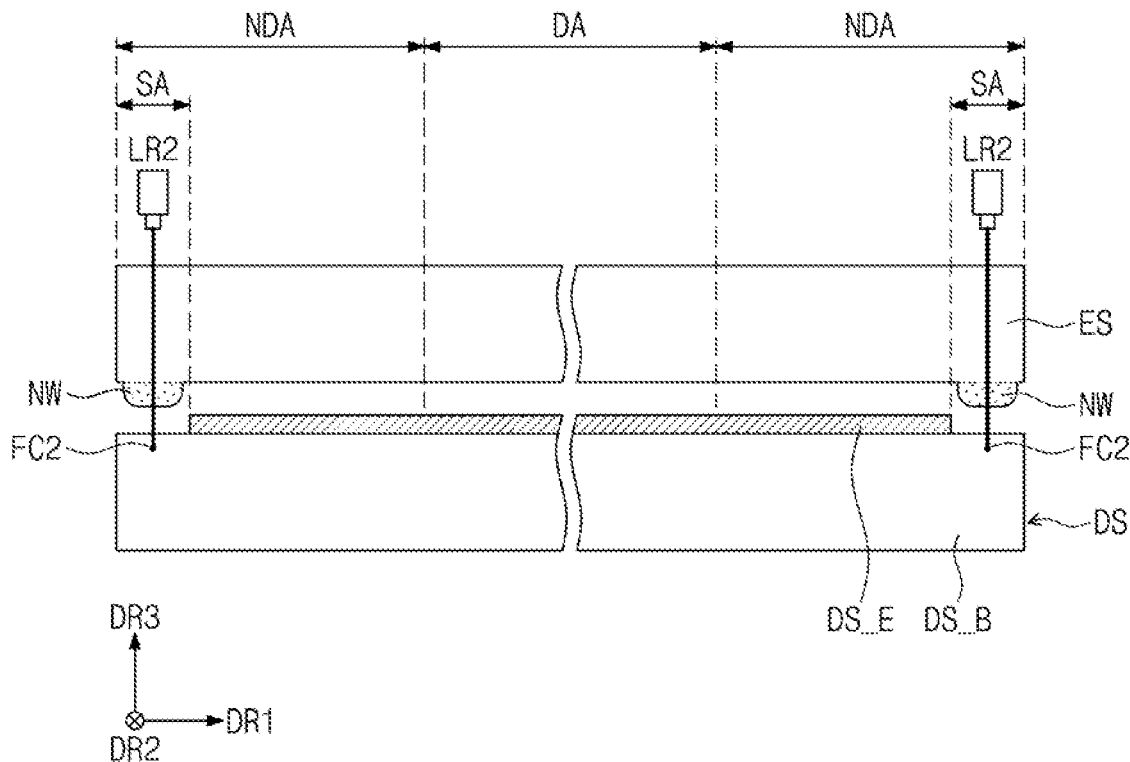

Thereafter, as illustrated in FIGS. 19 and 20, the encapsulation substrate ES on which the nanowire NW is formed is combined with the display substrate DS by radiating the second laser LR2 (S3). The second laser LR2 may be an ultrashort pulse laser. For example, the second laser LR2 may be a femtosecond laser.

According to an embodiment of the present invention, output energy of the second laser LR2 may be less than output energy of the first laser LR1. For example, the output energy of the first laser LR1 may range of about 8 µJ to about 12 µJ. The output energy of the second laser LR2 may range of about 2 µJ to about 3 µJ.

A second focus FC2, which is defined as a focus of the second laser LR2, is disposed inside the display substrate DS, which is adjacent to a top surface of the display substrate DS facing the encapsulation substrate ES. The second focus FC2 may be disposed on a plurality of areas. For example, the second focus FC2 of the second laser LR2 may move in an inner space of the display substrate DS, which overlaps the sealing area SA.

In FIG. 20, a direction in which the second laser LR2 oscillates is parallel to a direction from the encapsulation substrate ES toward the display substrate DS.

According to this embodiment, as the nanowire NW is combined with the display substrate DS, a first encapsulation part SM1 may be formed.

Figure 21:
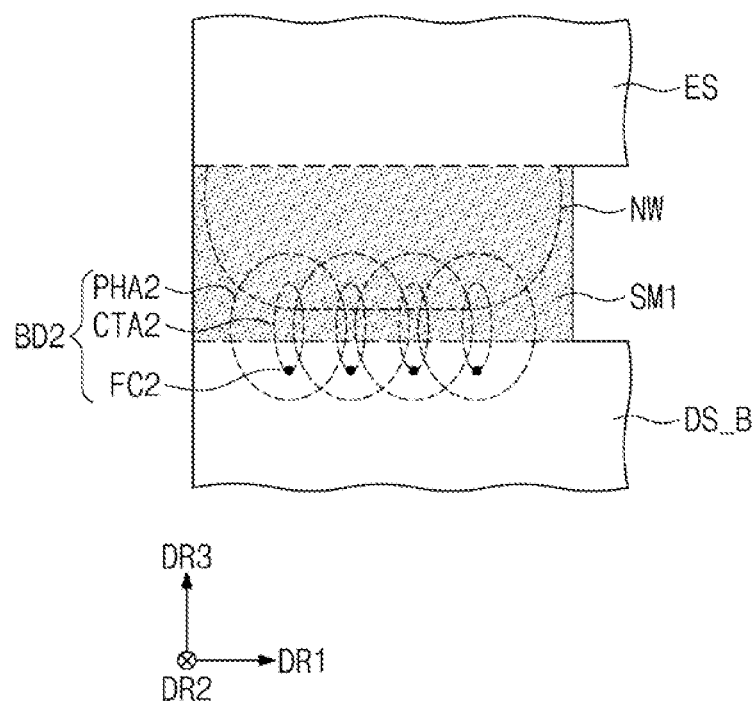
Figure 22:
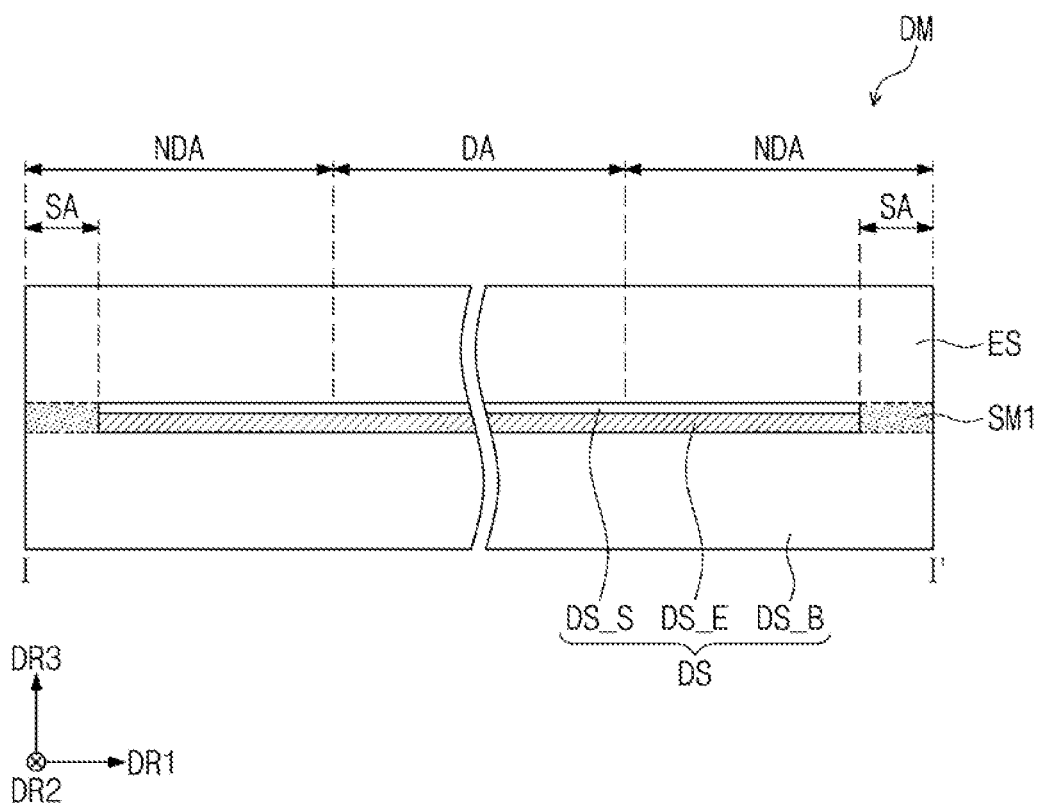

FIG. 21 is an enlarged cross-sectional view of the first encapsulation part SM1 according to an embodiment of the present invention. As illustrated in FIGS. 21 and 22, as the second laser LR2 is radiated onto the display substrate DS, the first encapsulation part SM1 may have a shape that is mixed with the nanowire NW by melting and expanding a portion of the display substrate DS. The first encapsulation part SM1 includes the above-described first bonding parts BD1 and the second bonding parts BD2, and the second bonding parts BD2 are formed to protrude from the point, at which the second focus FC2 is disposed, toward the encapsulation substrate ES.

The second bonding parts BD2 are formed to cross an interface between the nanowire NW and the display substrate DS. Thus, after the second laser LR2 is radiated, the interface between the nanowire NW and the display substrate DS may be discontinuous.

Also, unlike the embodiment of the present invention, when the encapsulation substrate ES, which does not include the nanowire NW, is combined with the display substrate DS, e.g., when a spaced distance between the encapsulation substrate ES and the display substrate DS is relatively large, the bonding parts have to be simultaneously formed from the encapsulation substrate ES and the display substrate DS. Thus, even if the encapsulation substrate ES and the display substrate DS are bonded to each other by using the femtosecond laser, accuracy of the bonding process may be deteriorated. However, according to an embodiment of the present invention, since the nanowire NW is preferentially formed on the encapsulation substrate ES and then adheres to the display substrate DS, the process accuracy and process stability may be increased. Accordingly, even if the width of the first encapsulation part SM1 decreases, the bonding strength may not decrease. As described above, the width of the first encapsulation part SM1 may range of about 50 μm to about 110 μm.

Figure 23:
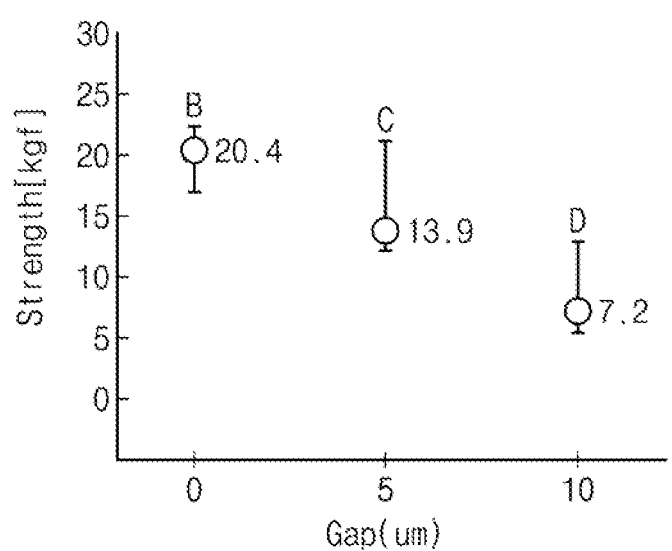
FIG. 23 is a graph illustrating bonding strength depending on a spaced distance between a display substrate and an encapsulation substrate.

FIG. 23 is a graph illustrating bonding strength depending on a spaced distance between a display substrate and an encapsulation substrate.

Referring to FIG. 23, as a spaced distance Gap between a display substrate DS and an encapsulation substrate ES on a sealing area SA increases, bonding strength may decrease. When a display module DM includes a first encapsulation part SM1 or a second encapsulation part SM2 on the sealing area SA, the spaced distance Gap may be defined as a distance between each of the encapsulation parts SM and the display substrate DS.

A reference symbol C illustrated in FIG. 23 represents bonding strength between the display substrate DS and the encapsulation substrate ES when the spaced distance Gap is 5 μm. Here, the bonding strength may be about 13.9 kgf. A reference symbol D illustrated in FIG. 22 represents bonding strength between the display substrate DS and the encapsulation substrate ES when the spaced distance Gap between the encapsulation substrate ES and the display substrate DS is 10 μm. Here, the bonding strength may be about 7.2 kgf.

The above-described reference symbol A may be the bonding strength when the spaced distance Gap is 0 μm. According to an embodiment of the present invention, before bonding the sealing substrate ES to the display substrate DS, as the nanowire NW is formed on the encapsulation substrate ES, the spaced distance Gap on the sealing area SA may decrease. For example, the bonding strength between the encapsulation substrate ES and the display substrate DS may increase.

Figure 24:
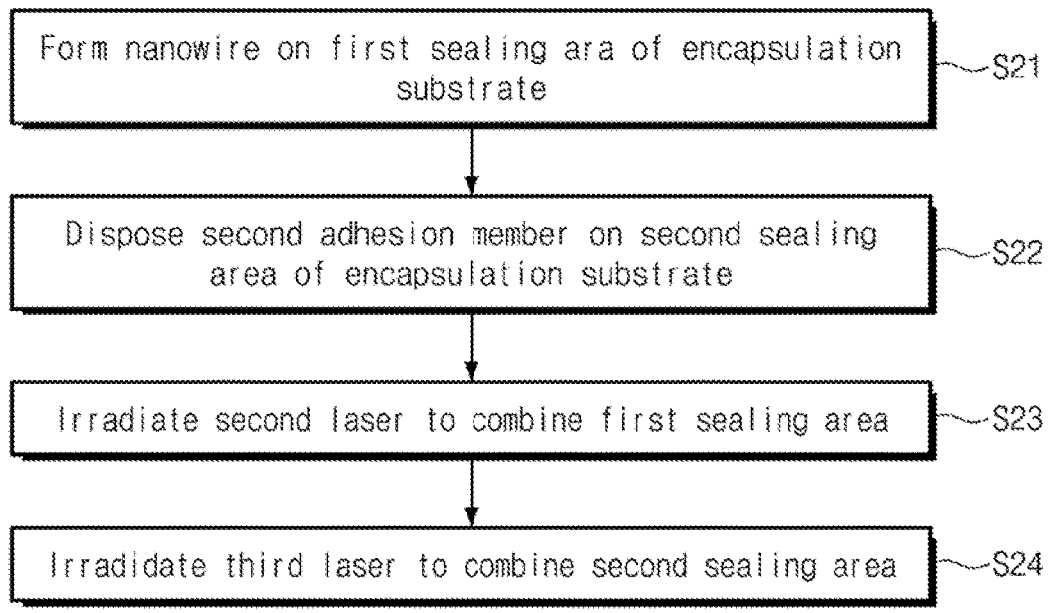
FIG. 24 is a flowchart illustrating a method for manufacturing a display device according to another embodiment of the present invention.

FIG. 24 is a flowchart illustrating a method for manufacturing a display device according to another embodiment of the present invention, and FIGS. 25 to 28 are views illustrating a process of manufacturing a display device according to another embodiment of the present invention. The cross-sectional views illustrated in FIGS. 25 to 28 correspond to a line III-III' illustrated in FIG. 13.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 24, a method of manufacturing a display device according to another embodiment of the present invention includes a process (S21) of radiating a first laser to form a nanowire on a first sealing area SA1 of an encapsulation substrate ES, a process (S22) of disposing a second encapsulation part on a second sealing area SA2 of the encapsulation substrate ES, a process (S23) of radiating a second laser to combine the sealing area SA1, and a process (S24) of radiating a third laser to combine the second sealing area SA1.

Hereinafter, the method of manufacturing the display device according to another embodiment will be described in more detail below with reference to FIGS. 25 to 28 together with FIG. 24.

The sealing area SA defined on each of the display substrate DS and the encapsulation substrate ES according to this embodiment has the same constituent as the sealing area SA described with reference to FIG. 13. For example, the sealing area SA according to this embodiment includes the first sealing area SA1 and the second sealing area SA2, which are described above.

Figure 25:
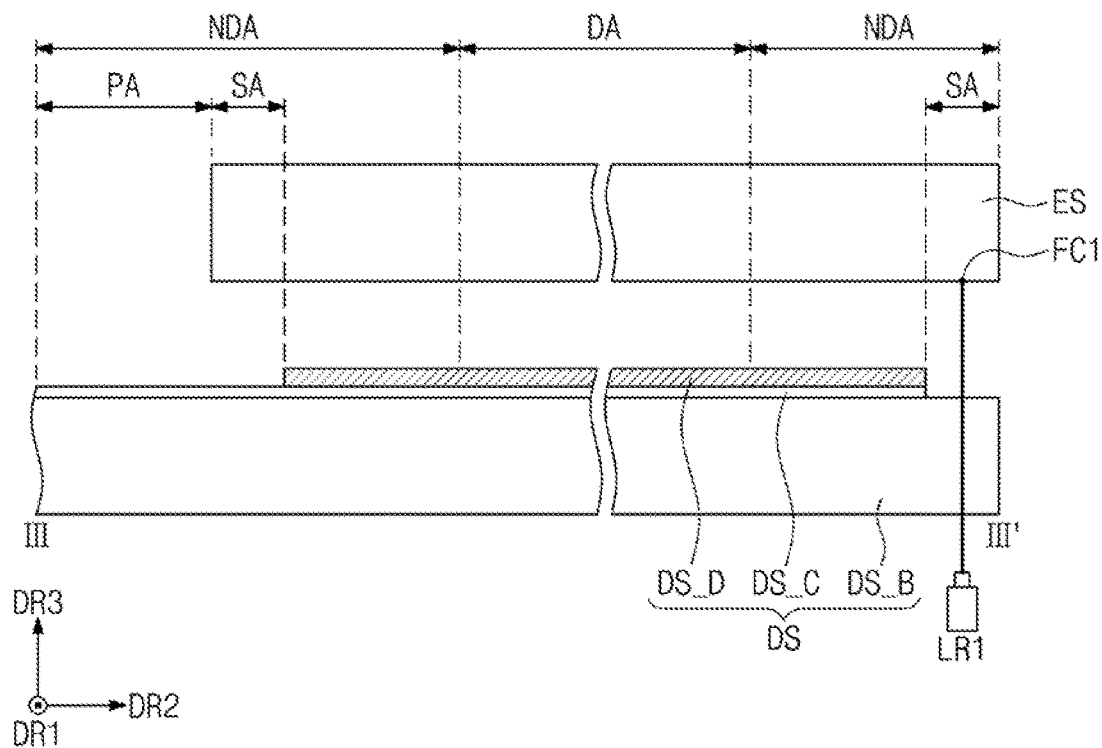
FIGS. 25 to 28 are views illustrating a process of manufacturing a display device according to another embodiment of the present invention.

First, as illustrated in FIG. 25, the display substrate DS and the encapsulation substrate ES are provided. In the process of providing the display substrate DS according to this embodiment, a circuit layer DS_C of the display substrate DS may be formed to extend to the second sealing area SA2 and the pad area PD.

The first laser LR1 is radiated onto the first sealing area SA1 of the encapsulation substrate ES (S21). The nanowire NW may be formed on a first surface SS1 of the encapsulation substrate ES by the first laser LR1.

Figure 26:
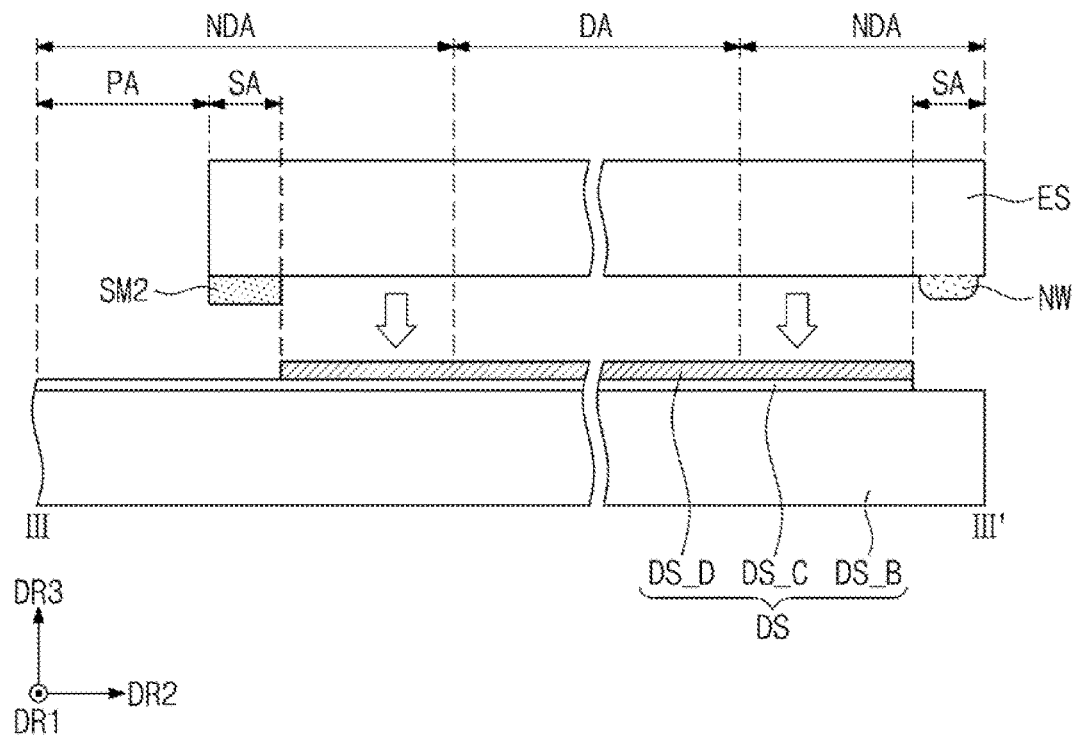

Thereafter, as illustrated in FIG. 26, a second adhesion member SM2' is disposed on the second sealing area SA2 of the encapsulation substrate ES (S22). In this embodiment, the second adhesion member SM2' may include a frit having the form of glass powder. For example, the second adhesion member SM2' has the form of gel paste in which an organic material and the frit having the form of glass powder are mixed with each other. The glass powder may be formed by sharply lowering heat applied to the glass.

Figure 27:
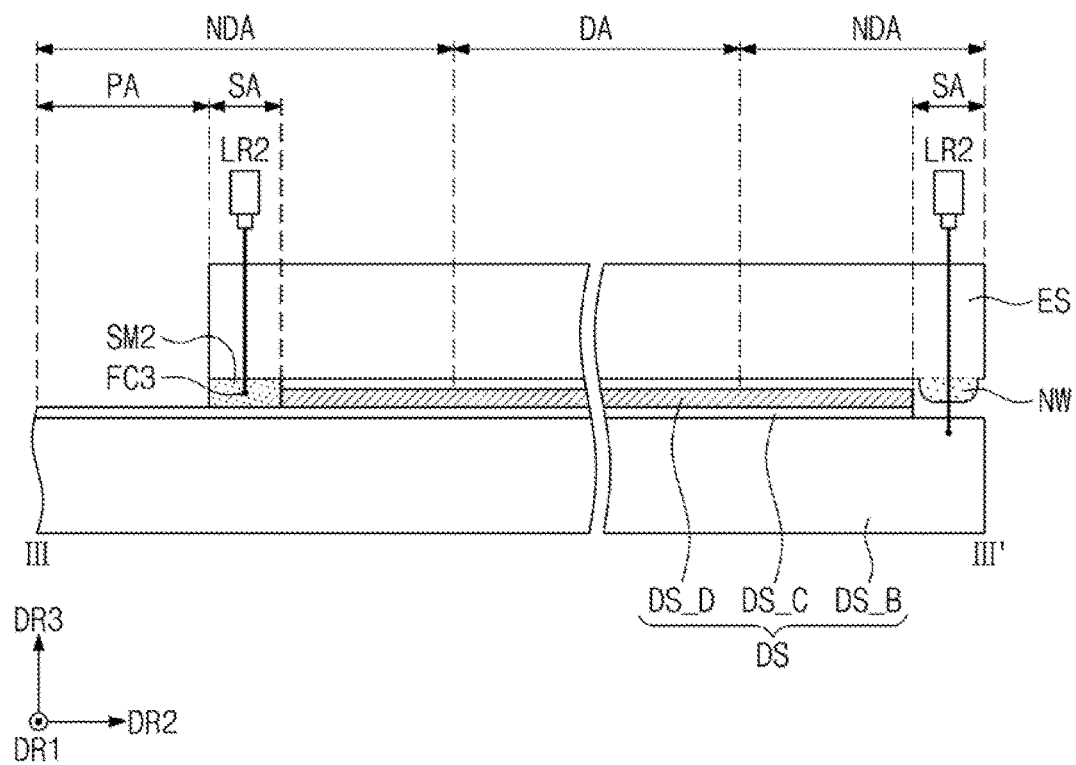

Thereafter, as illustrated in FIG. 27, the second laser LR2 is radiated onto the first sealing area SA1, and the third laser LR3 is radiated onto the second sealing area SA2 to combine the encapsulation substrate ES with the display substrate DS (S23, S24). The present invention is not particularly limited to the relationship between the radiation process of the second laser LR2 and the radiation process of the third laser LRS.

As the second laser LR2 is radiated, each of at least a portion of the nanowire NW formed on the first sealing area SA1 and a portion of the display substrate DS is melted and expanded to form a first encapsulation part SM1. The second laser LR2 has the same constituent as described above with reference to FIGS. 15 to 22, and thus their descriptions will be omitted.

In this embodiment, the third laser LR3 may be used to apply heat to the second adhesion member SM2'. For example, the third laser LR3 may be a CW laser.

As the third laser LR3 is radiated, an organic material of the second adhesion member SM2' disposed on the second sealing area SA2 is disappeared into air, and gel paste including the frit is cured to form a second encapsulation part SM2.

Figure 28:
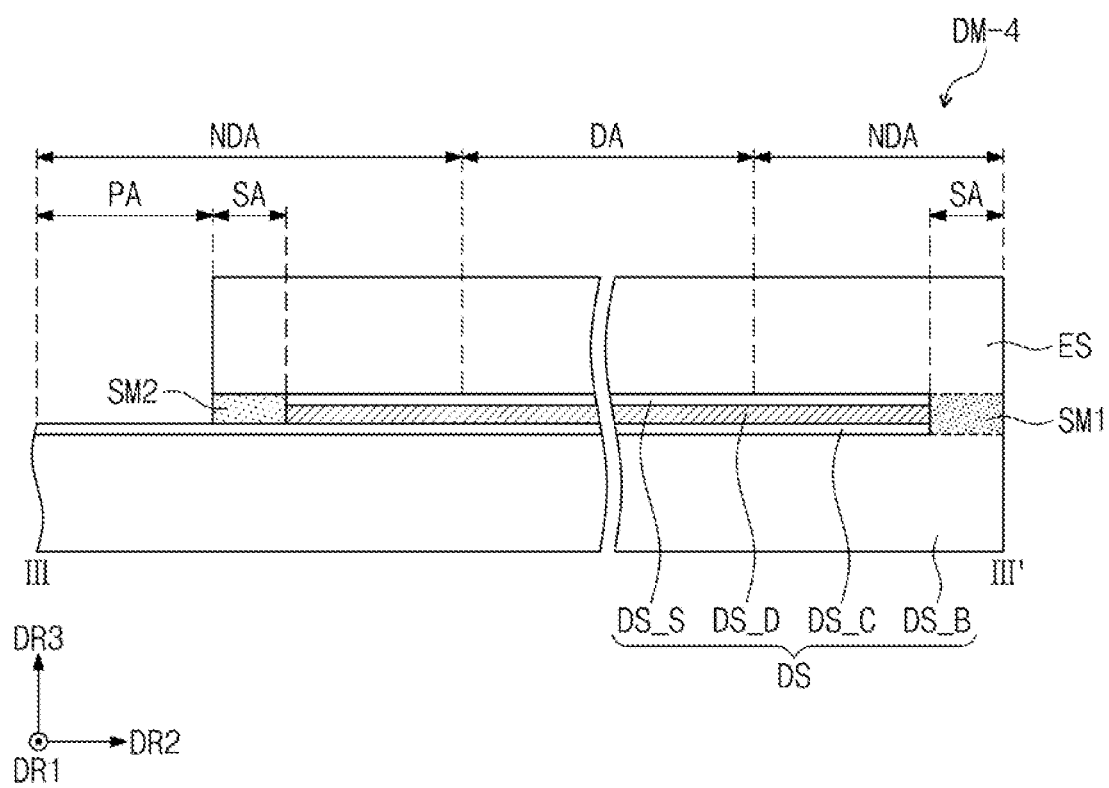

A state in which the display substrate DS and the encapsulation substrate ES are combined with each other by the first encapsulation part SM1 and the second encapsulation part SM2 is illustrated in FIG. 28. This state may be the same that of the display module DM-4 illustrated in FIG. 14.

It will be apparent to those skilled in the art that various modifications and variations can be made in the present invention. Thus, it is intended that the present invention covers the modifications and variations of this invention provided they come within the scope of the foregoing detailed description.

The invention claimed is:

1. A display device comprising:
a display module on which a display area and at non-display area configured to surround the display area are defined on a plane,
wherein the display module comprises:
a display substrate comprising a plurality of pixels disposed on the display area and comprising a glass material; and
an encapsulation substrate disposed to face the display substrate and comprising a glass material,
wherein the non-display area comprises a sealing area on which the display substrate and the encapsulation substrate are bonded to each other, and
a portion of the sealing area has a width of about 50 um to about 110 um.

2. The display device of claim 1, wherein the display module further comprises a first encapsulation part disposed on the sealing area to bond the display substrate to the encapsulation substrate,
wherein the first encapsulation part comprises the same material as each of the display substrate and the encapsulation substrate.

3. The display device of claim 2, wherein the first encapsulation part has a thickness of about 5 um to about 15 um on the sealing area.

4. The display device of claim 2, wherein a plurality of bonding areas are defined on the sealing area in a cross-section, and
each of an interface between the display substrate and the first encapsulation substrate and an interface between the encapsulation substrate and the first encapsulation part is discontinuous on the bonding area.

5. The display device of claim 4, wherein each of the bonding areas has a rounded shape in the cross-section.

6. The display device of claim 2, wherein the display substrate comprises:
a base layer;
a circuit layer disposed on the base layer and comprising a plurality of thin film transistor and a plurality of lines; and
a display layer disposed on the circuit layer overlapping the display area and comprising a plurality of display elements connected to the thin film transistors.

7. The display device of claim 6, wherein each of the plurality of display elements comprises an organic light emitting element.

8. The display device of claim 6, wherein the non-display area further comprises as pad area defined on the display substrate so as not to overlap the encapsulation substrate,
wherein the pad area of the display substrate is exposed by the encapsulation substrate.

9. The display device of claim 8, wherein the sealing area comprises:
first sealing area defined as a remaining area of an edge area of the non-display area except for an area of the edge area of the non-display area, which is adjacent to the pad area; and
a second sealing area defined between the pad area and the display area and connected to the first sealing area,
wherein the display module further comprises a second encapsulation part disposed between the display substrate and the encapsulation substrate, which overlap the second sealing area.

10. The display device of claim 9, wherein the first sealing area has a width less than or equal to that of the second sealing area.

11. The display device of claim 9, wherein the circuit layer is entirely disposed on an area of the display substrate except for the first sealing area.

12. The display device of claim 1, wherein the display module further comprises an input sensing layer disposed between the encapsulation substrate and the display substrate and comprising a plurality of input sensing electrodes,
wherein the input sensing layer does not overlap the sealing area on the plane.

13. The display device of claim 1, wherein the display module further comprises an input sensing layer disposed on the encapsulation substrate to face the display substrate with the encapsulation substrate therebetween and comprising a plurality of input sensing electrodes.

14. The display device of claim 1, wherein a thickness of the encapsulation substrate on the sealing area is greater that a thickness of the encapsulation substrate on the display area.

15. The display device of claim 1, wherein bonding strength between the display substrate and the encapsulation substrate on the portion of the sealing area is about 18 kgf or more.

16. A method for manufacturing a display device, the method comprising:
providing a display substrate and an encapsulation substrate, each of which has a display area and a non-display area surrounding the display area thereon;
forming a nanowire on the encapsulation substrate overlapping a sealing area defined as a partial area of the non-display area; and
combining the encapsulation substrate and the display substrate with each other,
wherein the forming of the nanowire comprises irradiating a first laser, which is a ultrashort pulse laser, onto the encapsulation substrate overlapping the sealing area, and
the combining of the encapsulation substrate and the display substrate with each other comprises irradiating a second laser, which is a ultrashort pulse laser, onto the display substrate overlapping the sealing area.

17. The method of claim 16, wherein, in the forming of the nanowire the nanowire is formed to protrude from a first surface, which faces the display substrate, of the first surface and a second surface of the encapsulation substrate, which face each other.

18. The method of claim 17, wherein, in the forming of the nanowire, a focus of the first laser is disposed on the first surface of the encapsulation substrate.

19. The method of claim 17, wherein, in the forming of the nanowire, as the first laser is irradiated onto the encapsulation substrate, the nanowire is formed by melting and expanding a portion of the encapsulation substrate.

20. The method of claim 16, wherein, in the combing of the encapsulation substrate and the display substrate with each other, a focus of the second laser is disposed inside the display substrate.

21. The method of claim 16, wherein, in the combing of the encapsulation substrate and the display substrate with each other,
a first encapsulation part is formed between the encapsulation substrate and the display substrate, and
as the second laser is irradiated onto the display substrate, the first encapsulation part is formed to be mixed with the nanowire by melting and expanding a portion of the display substrate.

22. The method of claim 21, wherein the first encapsulation part has a width of about 50 um to about 110 um.

23. The method of claim 21, wherein the first encapsulation part has a thickness of about 5 um to about 15 um.

24. The method of claim 16, wherein output energy of the first laser is greater than output energy of the second laser.

25. The method of claim 16, wherein the providing of the display substrate comprises:
forming a circuit layer comprising a plurality of thin film transistors and a plurality of lines on a base layer; and
forming a display layer comprising a plurality of display elements on the circuit layer overlapping the display area.

26. The method of claim 25, wherein the non-display area of the display substrate further comprises a pad area that does not overlap the encapsulation substrate,
wherein, in the combining of the display substrate and the encapsulation substrate with each other, the pad area of the display substrate is exposed by the encapsulation substrate.

27. The method of claim 26, wherein the sealing area comprises:
a first sealing area defined as a remaining area of an edge area of the non-display area except for an area of the edge area of the non-display area, which is adjacent to the pad area; and
a second sealing area defined between the pad area and the display area and connected to the first sealing area,
wherein the nanowire is formed on the first sealing area of the first sealing area and the second sealing area.

28. The method of claim 27, wherein the combining of the encapsulation substrate and the display substrate with each other further comprises:
disposing a second adhesion member on the second sealing area between the encapsulation substrate and the display substrate; and
forming a second encapsulation part by irradiating a third laser and applying heat the second adhesion member.

29. The method of claim 28, wherein the first sealing area has a width less than a width of the second sealing area.

30. The method of claim 28, wherein the third laser comprises a CW laser.

31. The method of claim 28, wherein the second adhesion member comprises glass powder.

32. The method of claim 16, further comprising forming an input sensing layer comprising a plurality of input sensing electrodes on an upper or lower portion of the encapsulation substrate.

33. The method of claim 16, wherein each of the first laser and the second laser comprises femtosecond laser.

34. The method of claim 16, wherein the providing of the encapsulation substrate comprises forming an etching groove in the display area of the encapsulation substrate,
wherein the etching groove is defined in a first surface, which faces the display substrate, of the first surface and a second surface of the encapsulation substrate, which face each other.

35. The method of claim 16, wherein, in the combining of the encapsulation substrate and the display substrate with each other,
as the second laser is irradiated, a plurality of bonding parts are formed between the encapsulation substrate and the display substrate on the sealing area, and
an interface between the nanowire and the display substrate within the bonding parts is discontinuous.

36. A method for manufacturing a display device, the method comprising:
providing a display substrate and an encapsulation substrate, each of which has a display area and a non-display area surrounding the display area thereon;
forming a nanowire on one surface of the encapsulation substrate by irradiating a first laser, which is a ultrashort pulse laser, onto a sealing area defined as a partial area of the non-display area of the encapsulation substrate; and
irradiating a second laser, which is ultrashort pulse laser, to combine the nanowire of the encapsulation substrate with the display substrate,
wherein, in the forming of the nanowire, a focus of the first laser is disposed on the one surface of the encapsulation substrate, and
in the combining of the encapsulation substrate with the display substrate, a focus of the second laser is disposed inside the display substrate.

* * * * *